（12) United States Patent
Tsuzuki et al.

(10) Patent No.: US 6,184,457 B1
(45) Date of Patent: Feb. 6, 2001

(54) PHOTOVOLTAIC DEVICE MODULE

(75) Inventors: Koji Tsuzuki, Ikoma; Tsutomu Murakami, Nara; Yoshifumi Takeyama, Soraku-gun; Koichi Shimizu, Kyotanabe, all of (JP)

(73) Assignee: Canon Kabushiki Kaisha, Tokyo (JP)

( * ) Notice: Under 35 U.S.C. 154(b), the term of this patent shall be extended for 0 days.

(21) Appl. No.: 09/210,998

(22) Filed: Dec. 15, 1998

(30) Foreign Application Priority Data

Dec. 22, 1997 (JP) .................................................. 9-352767

(51) Int. Cl.⁷ .......................... H01L 31/05; H01L 31/20
(52) U.S. Cl. ..................... 136/256; 136/251; 136/244; 136/258; 136/259; 257/433; 257/452; 257/457; 257/464; 257/461
(58) Field of Search .................. 136/256, 251, 136/244, 265, 258 AM, 259; 257/433, 452, 457, 464, 461

(56) References Cited

U.S. PATENT DOCUMENTS

| 4,918,507 | * | 4/1990 | Yoshida ................................ 257/459 |
| 5,131,956 | * | 7/1992 | Oohara et al. ....................... 136/256 |
| 5,679,176 |   | 10/1997 | Tsuzuki et al. ..................... 136/251 |
| 5,942,048 | * | 8/1999 | Fujisaki et al. ..................... 136/256 |
| 5,998,729 | * | 12/1999 | Shiomi et al. ...................... 136/251 |

* cited by examiner

*Primary Examiner*—Alan Diamond
(74) *Attorney, Agent, or Firm*—Fitzpatrick, Cella, Harper & Scinto

(57) ABSTRACT

In a photovoltaic device module comprising a plurality of photovoltaic devices connected electrically through a metal member, an insulating member is so provided as to avoid contact between an edge portion of the photovoltaic device and the metal member. This can provide a photovoltaic device module which is inexpensive, easy to operate and highly reliable.

18 Claims, 16 Drawing Sheets

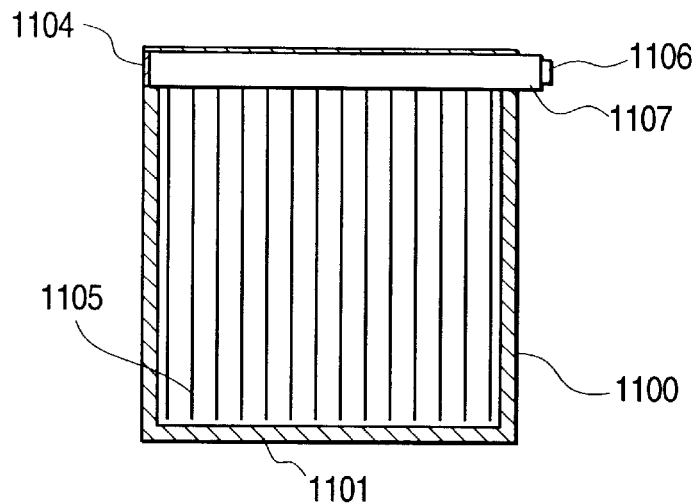
FIG. 11A
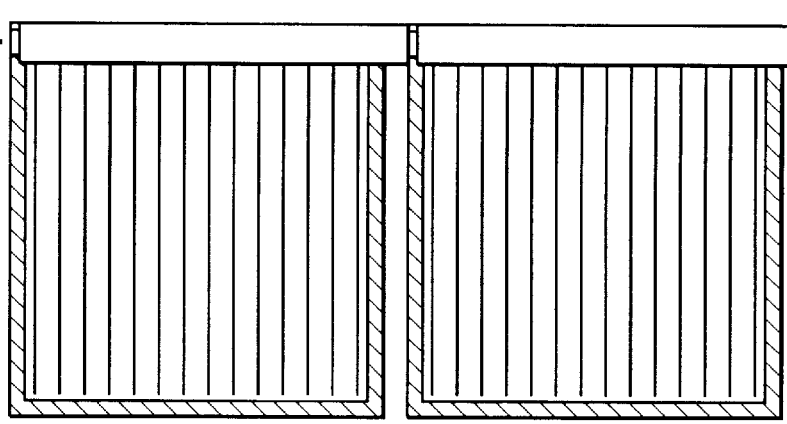
FIG. 11B
FIG. 11C
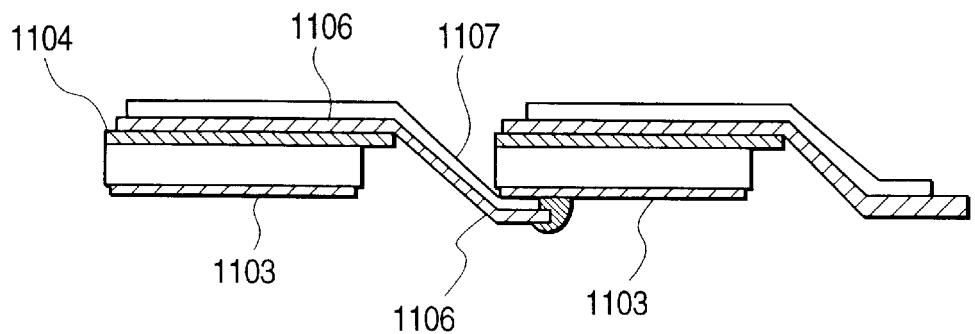

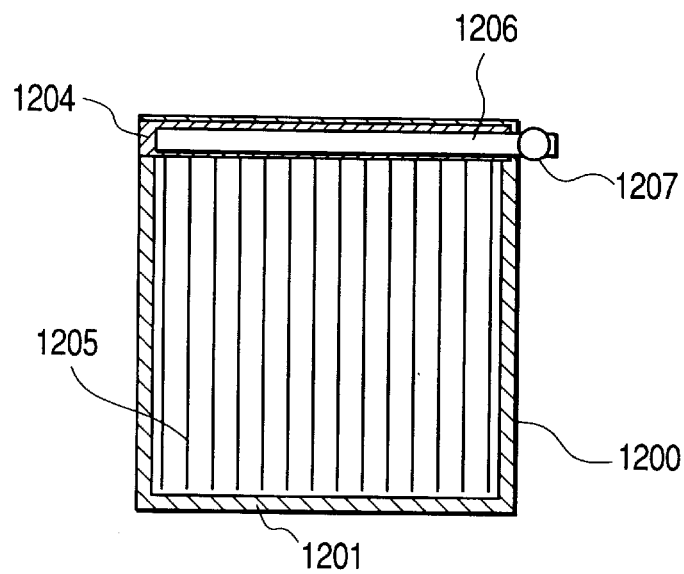
FIG. 12A
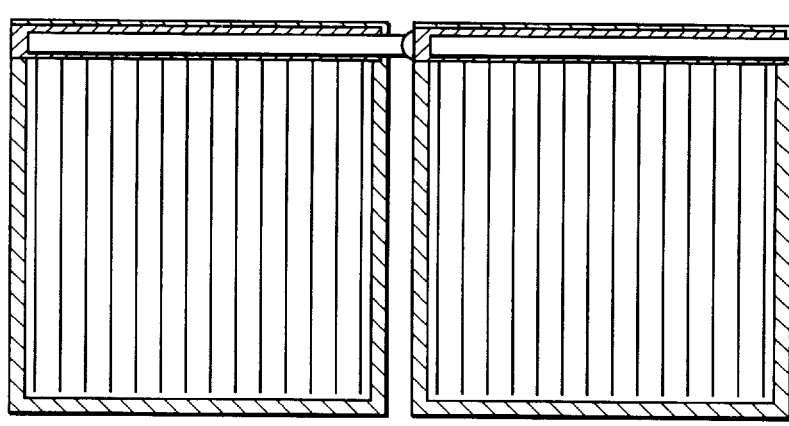
FIG. 12B
FIG. 12C
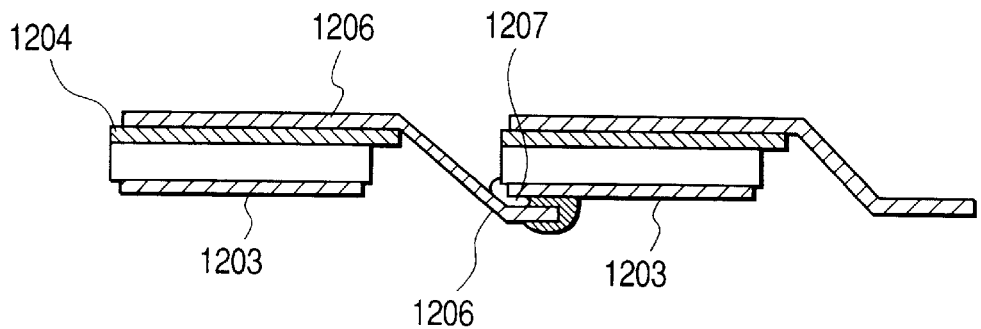

PHOTOVOLTAIC DEVICE MODULE

BACKGROUND OF THE INVENTION

1. Field of the invention

This invention relates to a photovoltaic device module (solar cell module), and more particularly to a photovoltaic device module having high reliability against flexural fatigue at its electrically connected portions.

2. Related Background Art

In recent years, consciousness of environmental problems has spread on a worldwide basis. In particular, due to anxieties related to the phenomenon whereby $CO_2$ emissions make the earth's environment warm, there is an increasingly earnest demand for clean energy. Solar cells are likely clean energy sources because of their safety and readiness in handling.

Solar cells have various forms. They are typified by:
(1) crystalline silicon solar cells;
(2) polycrystalline silicon solar cells;
(3) amorphous silicon solar cells;
(4) copper indium selenide solar cells; and
(5) compound semiconductor solar cells.

Of these, thin-film crystalline silicon solar cells, compound semiconductor solar cells and amorphous silicon solar cells are recently and extensively being developed in various fields because they can be made in a large-area at a relatively low cost. In particular, among these solar cells, thin-film solar cells typified by amorphous silicon solar cells produced by depositing silicon on a conductive substrate and forming a transparent conductive layer thereon, are considered promising as a form of modules for the future because they are light-weight and also highly impact resistant and flexible.

Usually, in battery-adaptable solar cells, a single-sheet solar cell alone does not have a sufficient output voltage. Hence, it is often necessary to use a plurality of solar cell devices connected in series. Also, in order to gain electric current quantity, solar cell devices are connected in parallel, and in some cases both the series connection and the parallel connection are used in combination.

An example of a photovoltaic device module will be described with reference to FIGS. 1, 2A, 2B, 3, 4A and 4B.

First, an amorphous type photovoltaic device will be described.

FIG. 1 is a diagrammatic plan view showing an example of the amorphous type photovoltaic device, as viewed on its surface (light-receiving surface) side.

In FIG. 1, reference numeral 201 denotes the photovoltaic device, comprising a substrate which supports the whole photovoltaic device and an amorphous semiconductor layer and an electrode layer which are formed on the substrate. The substrate is made of a metallic material such as stainless steel, and the semiconductor layer comprises a back reflection layer, an n-type semiconductor layer, an i-type semiconductor layer, a p-type semiconductor layer, an n-type semiconductor layer, an i-type semiconductor layer and a p-type semiconductor layer which are superposed in this order from the bottom layer by a film-forming process such as CVD, and is so set up that electric power is generated in a good efficiency when exposed to light. As the uppermost electrode layer, a transparent conductive film of indium oxide or the like is formed so as to serve also as an anti-reflection means and as an electricity collection means.

To form the transparent conductive film, an etching paste containing $FeCl_3$, $AlCl_3$ or the like is coated by a process such as screen printing and then heated so that the film is removed partly in lines along etching lines 205. The transparent conductive film is removed partly so that any short-circuit which occurs between the support and the transparent conductive film when the photovoltaic device 201 is cut along its periphery does not adversely affect the effective light-receiving region of the photovoltaic device 201.

A collector electrode 202 for collecting generated electric power in good efficiency is formed on the surface of the photovoltaic device 201. In the case of the amorphous type photovoltaic device, the collector electrode 202 commonly makes use of a conductive ink comprised of a polymeric material formable at a relatively low temperature 201. In the present embodiment, to form the collector electrode 202, a conductive adhesive is provided around a wire formed of copper.

The photovoltaic device 201 thus produced can not be used as such for the generation of electricity. That is, it is necessary to form a terminal through which the generated electric power is led to a means for consuming or storing it. Alternatively, since a single power-generating cell usually has too low a generated voltage, it is necessary to form terminals for making voltage higher by connecting cells in series. Accordingly, an insulating member 204 is provided to ensure insulation between the substrate having a possibility of being laid bare to the outer edges of the photovoltaic device 201 and the electrode layer in the region lying outside the etching line 205 and whose performance is not secured. Then, an about 100 μm thick foil-like terminal member 203 made of a metal is connected to the collector electrode 202 using a conductive adhesive so that it can be used as a power-withdrawing terminal or a terminal for connecting in series another adjoining photovoltaic device constituted similarly.

How to connect the above photovoltaic device will be described below specifically. The above photovoltaic device can achieve materialize, e.g., an optimum operating voltage of 1.5 V and an optimum operating current of 1 A, i.e., an optimum output of 1.5 W under sunlight of AM-1.5.

When ten photovoltaic devices having such output power are used to constitute a module of 15 W, in an extreme case the following output characteristics are obtained. One is a series connection system, where an output with a high voltage and a low electric current can be obtained. In the case of a 15 W module, it is 15 V and 1 A. The other is a parallel connection system, where an output with a low voltage and a high electric current can be obtained, which is 1.5 V and 10 A. Of course, the series connection system and the parallel connection system may be combined appropriately so that intermediate output characteristics can be obtained.

FIGS. 2A and 2B are views showing devices connected in series. FIG. 2A is a diagrammatic plan view, and FIG. 2B a diagrammatic cross-sectional view. In FIGS. 2A and 2B, reference numeral 203 denotes a terminal member, which is a metallic foil member with a thickness of about 100 μm. After an insulating member 204 is provided to ensure insulation between the substrate having a possibility of being laid bare to the outer edges of the photovoltaic device 201 and the electrode layer in the region lying outside the etching line 205 and whose performance is not secured, the terminal member 203 is connected to a collector electrode 202 and is led outside the light-receiving region of the photovoltaic device 201. Thereafter, one end of the terminal member 203 is connected to the backside of an adjoining photovoltaic device 201 by using a solder 307. Thus the series connection is completed.

A crystal type photovoltaic device will be described below.

FIG. 3 is a diagrammatic plan view showing an example of how a terminal is led out of a single-crystal or polycrystalline, crystal type photovoltaic device. In FIG. 3, reference numeral 401 denotes a crystal silicon photovoltaic device, which is a semiconductor layer doped with boron ions on its bottom side and phosphorus ions on the topside. On the lower part of the semiconductor layer, an aluminum paste is coated as a back reflection layer and, on the further lower part of the aluminum paste, a silver paste is coated as a back electrode. On the still further lower part of the silver paste, a solder layer is superposed.

On the top of the semiconductor layer, a transparent electrode layer is formed for the purposes of preventing reflection and collecting electricity and, on the further upper part thereof, a sintered silver paste is formed. On the top thereof, a solder layer is further formed. In FIG. 3, the silver paste and the solder layer are depicted generically as a collector electrode 402. In the present embodiment, the collector electrode has such a form that, as shown in FIG. 3, it has a relatively wide linear land 402a at the middle of comb teeth extending to both sides. Also, on the land 402a, a member made of a metal and having substantially the same width as the land 402a is joined by soldering to form a terminal member 403.

FIGS. 4A and 4B are views showing devices comprising the above crystal type photovoltaic device connected in series. The terminal member 403 is connected with the collector electrode 402 on the land 402a and is outside the light-receiving region of the photovoltaic device 401. Thereafter, one end of the terminal member 403 is put around to the backside of an adjoining photovoltaic device 401 and connected thereto by soldering. Thus the series connection is completed.

However, the photovoltaic devices connected electrically in the above conventional manner require great care in handling.

More specifically, when a group of devices are moved to the next process line after series connection has been completed or when a group of devices are turned over to lead out a final terminal from the back, almost all stress may necessarily be applied to the terminal member 203 or 403 for handling. In such instances, the terminal member 203 or 403 is folded mostly at its edges 305 or 504 to have folds in some cases. As a result, the terminal member 203 or 403 having the folds thus formed comes to have so extremely low a strength that the stress may localize at the folded portions when repeated flexural stress is applied, thereby causing a break.

The above problem can not occur if the terminal member 203 or 403 is a member tough enough to withstand the stress. However, in such an instance, the terminal member 203 or 403 necessarily has such a thick shape that, when the solar cell is sealed later with a filler in order to improve weatherability, air bubbles occur at step portions.

In recent years, as a form of actual use of photovoltaic devices, the development of photovoltaic device modules suitable for installation on roofs of houses is practical and is considered very important.

Photovoltaic device modules installed outdoors are required to have environmental durability. In particular, in the case of amorphous photovoltaic device modules having a flexibility, a repeated flexural load may be applied to the modules when exposed to wind and rain.

The magnitude of such a repeated flexural load differs depending on the size of modules and the manner of installation. Usually, the stress may mostly localize at the connecting portions to cause cracks especially at the points coming into contact with the edge portions of photovoltaic devices, resulting in a break in some cases.

SUMMARY OF THE INVENTION

Accordingly, an object of the present invention is to provide a photovoltaic device module which has overcome the above problems, is inexpensive, enables easy operation and has high reliability.

Another object of the present invention is to provide a photovoltaic device module which can be prevented from breaking when handled and can be improved in yield. This object can be achieved by a photovoltaic device module comprising a plurality of photovoltaic devices connected electrically through a metal member, in which an insulating member for avoiding contact is so provided that at least an edge portion of the photovoltaic device does not come into contact with the metal member.

Still another object of the present invention is to provide a photovoltaic device module which can be improved in reliability against repeated flexing when the photovoltaic device modules are installed as an actual roof.

BRIEF DESCRIPTION OF THE DRAWINGS

FIG. 10A, FIG. 10B, FIG. 10C, FIG. 11A, FIG. 11B, FIG. 11C, FIG. 12A, FIG. 12B, FIG. 12C, FIG. 13A, FIG. 13B, FIG. 14A, FIG. 14B, FIG. 15A, FIG. 15B, FIG. 16A and FIG. 16B illustrate examples of the present invention.

DESCRIPTION OF THE PREFERRED EMBODIMENTS

As a result of extensive studies and development made in order to solve the problems discussed above, the present inventors have discovered that the problems can be solved by a photovoltaic device module comprising a plurality of photovoltaic devices connected electrically through a metal member, wherein an insulating member is so provided as to avoid contact between an edge portion of the photovoltaic device and the metal member.

They have also discovered that, in the state the insulating member has been provided, the metal member may preferably have a flexure R of 0.5mm or more.

They have still also discovered that the insulating member may preferably be provided on the whole surface of the metal member, that the insulating member may preferably have a color of the same color system as the surface color of the photovoltaic device or be transparent, that the insulating member may preferably comprise an insulating tape having at least a base material and an adhesive and the base material may have a thickness of 25 µm or more, and that the metal member may preferably comprise copper coated with any metal selected from at least silver, solder and nickel.

The present inventors have found that, as previously explained, in the state where edge portions of a metal member and a photovoltaic device are in contact with each other, the metal member develops extreme folds upon handling or repeated bending, resulting in poor durability.

As a result of extensive studies made in order to solve the above problems, it has been found that the present invention can bring about the following advantages.

(1) Since in the photovoltaic device module comprising a plurality of photovoltaic devices connected electrically through a metal member an insulating member is so provided as to avoid contact between an edge portion of the photovoltaic device and the metal member, both the metals by no means come into direct contact with each other, and the metal member itself can be prevented from developing extreme folds, so that its service lifetime against flexure can be made longer. Especially where the photovoltaic device is cut out of a rolled product to produce it, the metal member is more likely to break because of burrs present at its edges, but the insulating member acts as a cushioning material to prevent breakage.

Figure 6:
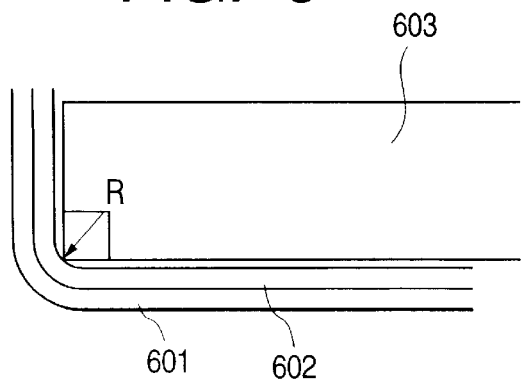
FIG. 6 illustrates a flexure R referred to in the present invention.

(2) Since the metal member may have a flexure R of 0.5 mm or more in the state the insulating member has been provided, the service lifetime against flexure can be made longer. FIG. 6 illustrates the flexure R. A metal member 601 provided with an insulating member 602 has a greater flexure R than the case where it has no insulating member 602; thus, the metal member 601 can be prevented from developing extreme folds.

(3) Since the insulating member may be provided on the whole surface of the metal member, the metal member can be covered. Since usually the part where the metal member is provided is a protruded portion of the photovoltaic device, the module has a thin surface resin material and has a low scratch resistance there. Since, however, the insulating member is provided on the whole surface of the metal member, the scratch resistance on the metal member can be improved.

(4) Since also the insulating member may have almost the same color as the color of solar cells, the module can have an improved visual appearance. More specifically, the metal member will usually be a bus bar connected with a collector electrode, to which potting or soldering is applied using a conductive paste, and hence its visual appearance is not so good. When the insulating member has almost the same color, such a portion can be hidden; thus, the visual appearance can be improved.

(5) In the case where the insulating member is transparent, the photovoltaic device can be improved in conversion efficiency. This does not matter when the insulating member has the same shape and size as the metal member. When, however, the insulating member has a shape and size larger than the metal member, the transparent insulating member does not shut out the light; thus, a photovoltaic device not causing a drop of conversion efficiency can be provided.

(6) Since also the insulating member may comprise an insulating tape having at least a base material and an adhesive and the base material may have a thickness of 25 µm or more, the following advantages can be expected: The insulating member having a base material thickness of 25 µm or more can be kept from being broken by the burrs at edges of the photovoltaic device, and the insulating member in the form of a tape can be placed by a simple process; thus, such constitution enables very good mass productivity.

(7) The metal member may preferably comprise copper coated with any metal selected from at least silver, solder and nickel. Use of copper makes it possible to provide an electrode member which has a low resistance loss and is inexpensive. In the case where the copper is further coated with any metal selected from silver, solder and nickel, the type of an adhesive used when the insulating tape is provided can be selected freely.

Embodiments of the present invention will be described below in detail.

Figure 1:
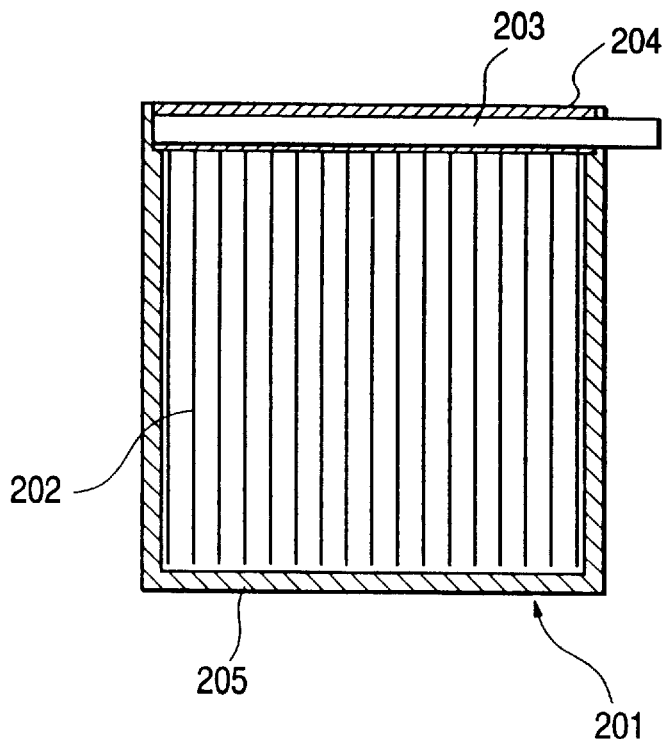
FIG. 1, FIG. 2A and FIG. 2B illustrate an example of an amorphous type photovoltaic device or module.
Figure 3:
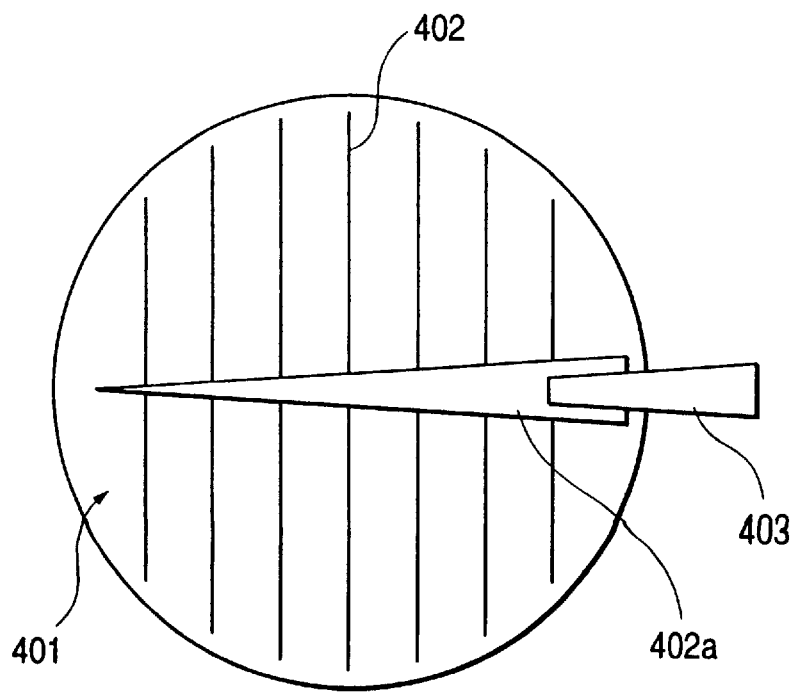
FIG. 3, FIG. 4A and FIG. 4B illustrate an example of a crystal type photovoltaic device or module.
Figure 2A:
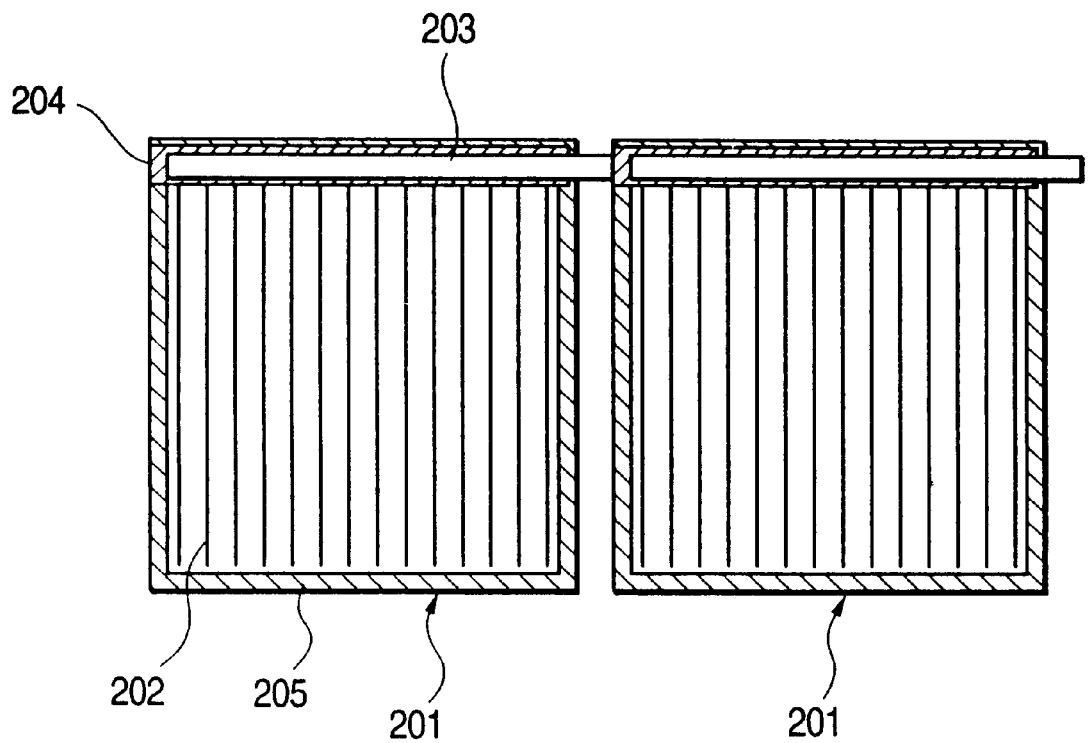
Figure 2B:
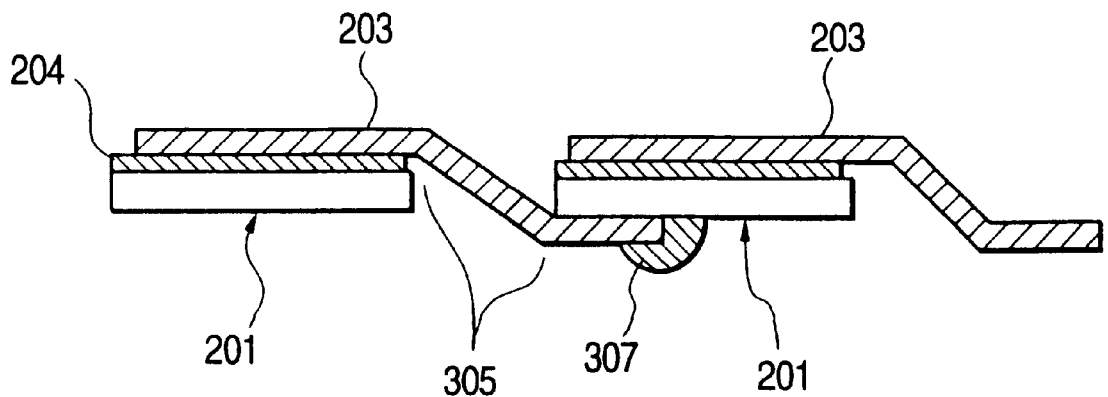
Figure 4A:
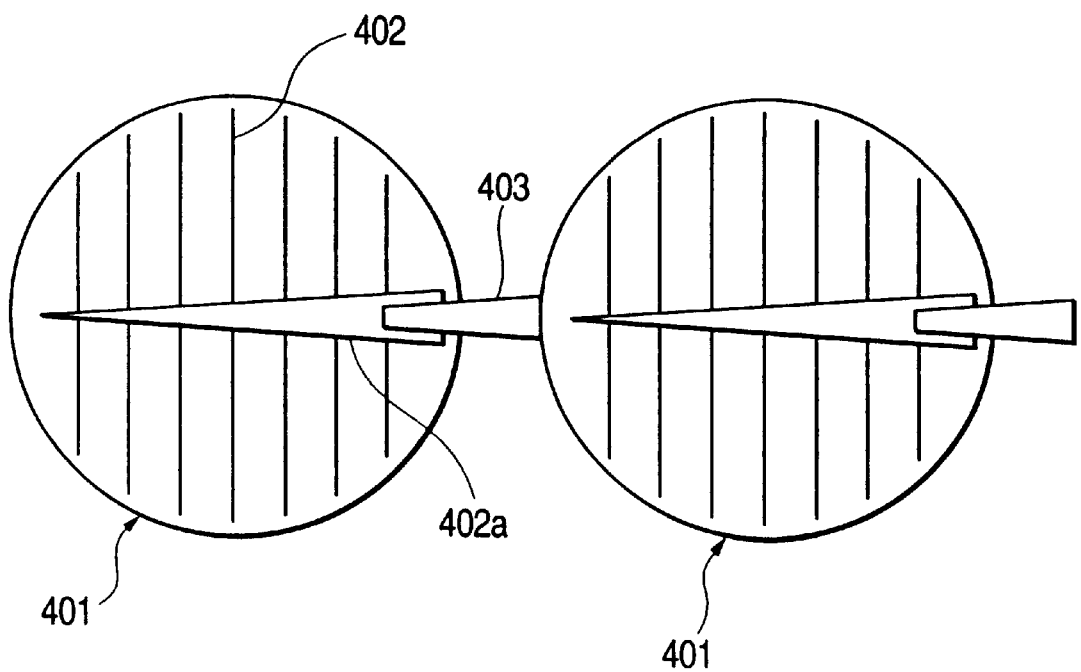
Figure 4B:
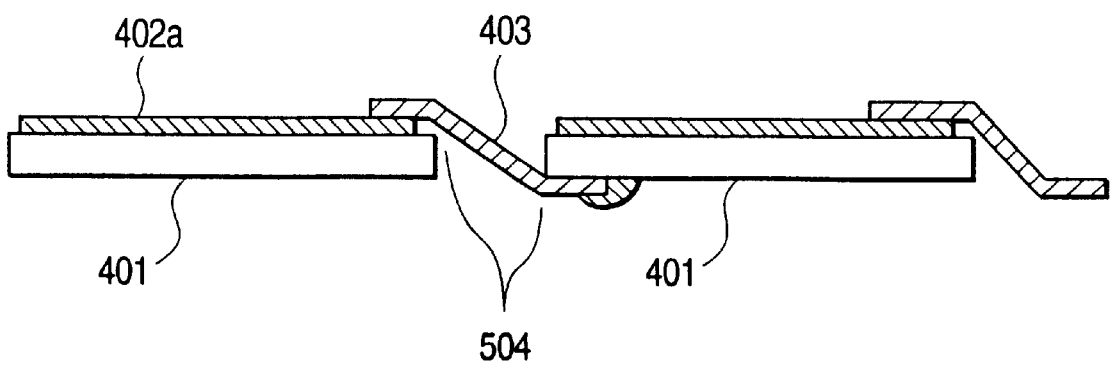
Figure 5A:
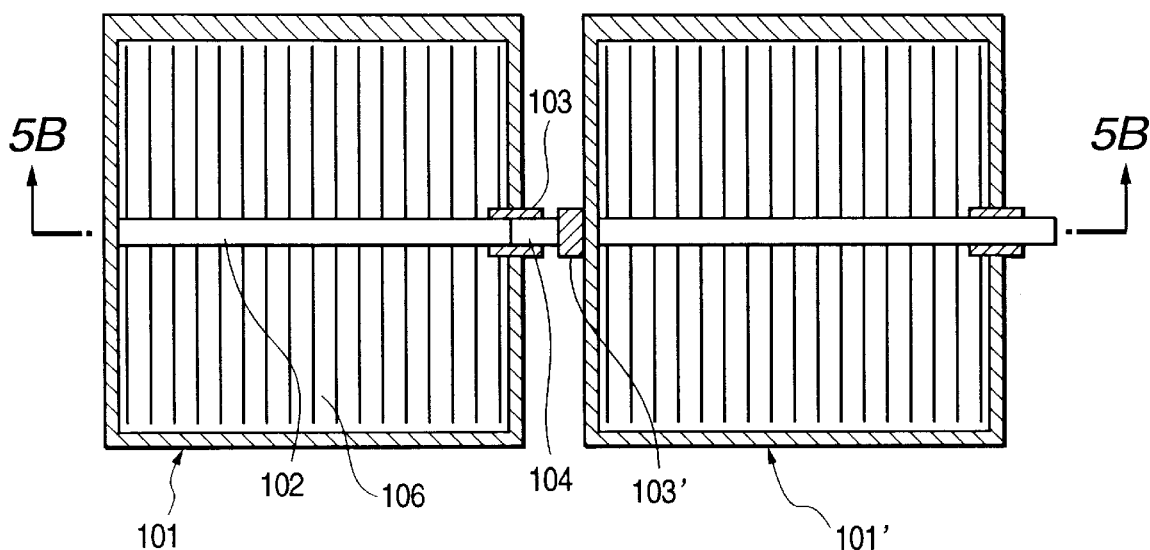
FIG. 5A, FIG. 5B, FIG. 7A and FIG. 7B illustrate preferred examples of the photovoltaic device modules of the present invention.
Figure 5B:
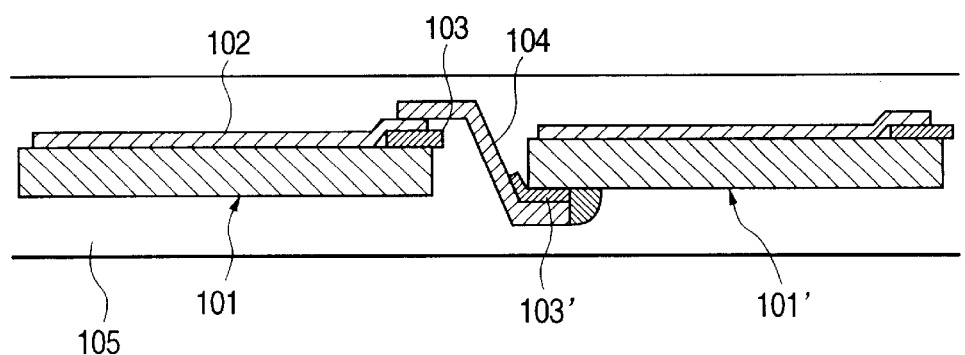

FIGS. 5A and 5B illustrate an example of the photovoltaic device module of the present invention. FIG. 5A is a diagrammatic plan view, and FIG. 5B a cross-sectional view along the line 5B—5B in FIG. 5A. In FIGS. 5A and 5B, reference numerals 101 and 101' each denote a photovoltaic device; 102, a bus bar; 103 and 103', each an insulating member; 104, a metal member; 105, a covering material; 106, a collector electrode. The two photovoltaic devices 101 and 101' are connected through the metal member 104. The insulating members 103 and 103' are so provided that edge portions of the photovoltaic devices do not come into contact with the metal member 104.

Bus bar 102

The above bus bar plays a role in the collection of electricity to further collect at one end the electric currents flowing through the collector electrode 106. From such a viewpoint, a material used for the bus bar may preferably be a material having a low volume resistivity and be supplied stably on an industrial scale. As the material, copper may preferably be used, which has a good workability and is inexpensive.

When copper is used, a thin metal layer may be provided on the surface for the purposes of anti-corrosion and anti-oxidation. Such a surface metal layer may preferably be formed using, e.g., silver, palladium, an alloy of silver and palladium, a noble metal which is hardly corrosive such as gold, or a metal having good anti-corrosion properties such as nickel, solder and tin. The surface metal layer may be formed by a process, e.g., vapor deposition, plating or cladding, which enables relatively easy formation.

The bus bar may preferably have a thickness of from 50 µm to 200 µm. The one with a thickness larger than 50 µm can ensure cross-section large enough to adapt well to the density of electric currents generated in the photovoltaic device 101 and also makes itself substantially suitable as a mechanical joining member. Meanwhile, the larger the thickness the bus bar has, the smaller resistance loss it can have. The one with a thickness smaller than 200 µm, however, can be covered with the surface covering material in a gentle slope.

The bus bar may be provided in any number depending on the form of the substrate and is by no means limited to a single strap. The bus bar used here may preferably have almost the same length as the size of the substrate on which it is to be provided. There are no particular limitations also on its shape. Bus bars in the form of a column or a foil may also be used.

Metal Member 104

The metal member 104 according to the present invention is provided to connect the photovoltaic devices (101 and 101') electrically or mechanically with each other. In the case where they are connected mechanically in series, usually one end of the metal member 104 is connected to the bus bar 102 on one photovoltaic device 101 by a process such as soldering, and the other end thereof is connected to the backside of the other photovoltaic device 101'. In the case where they are connected in parallel, one end of the metal member 104 is connected to the bus bar 102 on one photovoltaic device 101 by a process such as soldering, and the other end thereof is connected to the bus bar 102 on the other photovoltaic device 101'.

Materials, shape and thickness to be employed in the metal member are basically the same as those detailed for the bus bar 102.

Insulating Member 103

The insulating members 103 and 103' according to the present invention are so provided that at least edge portions of the photovoltaic devices 103 and 103' do not come into contact with the metal member 104, to avoid both from coming into direct contact so that the metal member 104 can be prevented from developing extreme folds and its service lifetime against flexure can be made longer. Hence, any materials may be used basically without any limitations so long as they can also avoid the mutual contact and also are flexible. Preferred are materials having a good adhesion to the metal member 104, having a high mechanical strength to flexure and also having durability in the post-step heating process.

With regard to adhesion to the metal member 104, adhesion may be sufficient so long as it is an adhesive force necessary only to keep the insulating members bonded to the metal member 104 without coming off after the former is bonded to the latter and until they are brought to the step of lamination. As an adhesive force necessary only to withstand some external force, it may preferably be 3 kgf/cm$^2$ or more as tensile shear strength.

With regard to mechanical strength, as will be detailed later, the flexure R given in the state the insulating member has been provided on the metal member 104 may be 0.5 mm or more, and this is effective for flexing resistance. Especially when the insulating member is in the form of a film or a tape, materials having 10,000 times (25° C.) or more of the number of flexings (MIT) according to JIS-P-8115 are used in preference as film single materials. Also, in the case where the insulating member is a material obtained by resin dotting, it can attain a sufficient flexing resistance when it has a hardness of 40 or less as prescribed in JIS-A.

With regard to thermal resistance, any materials may be used without any problem so long as the insulating member does not melt completely and does not make it impossible to avoid the direct contact of the metal member 104 with the edge portion of the photovoltaic device 101. Desirable are those which may cause as small a change in thickness as possible due to any shrinkage before and after heating. Stated specifically, those having a rate of heat shrinkage of 2% or less are desirable.

Specific insulating member materials which satisfy the above properties may include organic high-polymer resins of acrylic, urethane, polyester, polyimide, vinyl chloride, silicone, fluorine, polyethylene and polypropylene types, and glass cloth, any of which may be used without any particular limitations.

As the form of the insulating member, various forms may be used, including forms of a fused or molten resin, a film- or rubber-like resin, an adhesive and a tape.

In the case of the form of a fused or molten resin or an adhesive, the resin is applied to contact areas by potting using, e.g., a dispenser, and thereafter cured by energy such as heat and moisture. In the case of the form of a film or a tape, the film or tape may only be placed on the contact areas. Among the above forms, those having the form of a tape may more preferably be used because the insulating member can be placed through a simple step and simultaneously such materials are readily adaptable to mass production apparatuses. That is, the insulating member may comprise an insulating film or tape having at least a base material and an adhesive, and the base material may have a thickness of 25 µm or more.

As the base material of the film or tape, usable are, e.g., as specific materials, polyethylene terephthalate, PVC, polyimide, polyether imide, PPS, polypropylene, polyurethane, acryl, PEN, PFA, PTFE, polyester nonwoven fabric, glass nonwoven fabric, and composite base materials of any of the foregoing. In particular, materials that can provide the base material with a stronger body are more preferably used because the amount of flexure at the contact areas can be made smaller. Film base materials having a Shore D-hardness of 50 or more are particularly preferred, as exemplified by polyethylene terephthalate (Shore D-hardness: 70 or more), polycarbonate (Shore D-hardness: 70 or more) and high-density polyethylene (Shore D-hardness: 60 or more).

With regard to the thickness of the insulating member, the larger the thickness it has, the higher rigidity it has and the more effective it can be for its flex life. If, however, it has an extremely large thickness, the photovoltaic device module may have a great unevenness at the part where the insulating members are placed, resulting in loss of flatness of itself and simultaneously making it difficult to cover them completely with the covering material 105 provided surroundingly, thereby causing to cause faulty packing. If, on the other hand, the insulating member has an extremely small thickness, it may have so weak a rigidity that not only its inherent function may lower but also it may break because of burrs present at edges of the metal member 104 and photovoltaic device 101. In view of balancing of these, the base material of the insulating member may preferably have a thickness of from 25 µm to 200 µm. Because of a thickness of 25 µm or more, the insulating member can be kept from its run-through or break due to the burrs formed at edges of the metal member 104 and photovoltaic device 101. Because of a thickness of 200 µm or less, any extreme unevenness can be prevented, and the flatness and packing of the module can be maintained.

With regard to the color of the insulating member, various colors may be used without any particular limitations.

In the case where the insulating member has almost the same color as the photovoltaic device, the photovoltaic device module can be improved in overall visual appearance. More specifically, in the case where the metal member is a bus bar connected with the collector electrode 106 as will be detailed later, potting or soldering is applied thereto using a conductive paste, and hence its visual appearance is not necessarily good. However, since the insulating member has almost the same color, such a portion poor in visual appearance can be hidden completely.

In the case where the metal member 104 is formed over the effective area of the photovoltaic device 101, the conversion efficiency can be improved when the insulating member is transparent. More specifically, in such an instance where the metal member 104 is present over the power generation effective region, protruding portions of the insulating member shut out sunlight when the insulating member is placed on the metal member 104, resulting in a drop of conversion efficiency. Since the insulating member may be transparent, the size of the insulating member can be selected arbitrarily, and also a photovoltaic device not exhibiting such a drop in conversion efficiency can be provided.

The insulating member may be so provided that an edge portion of the photovoltaic device 101 does not come into contact with the metal member 104, and may have any length and any width. It may also be so placed as to cover the whole metal member 104 without any problem.

Flexure R of the Metal Member when the Insulating Member Has Been Provided

The flexure R of the metal member when the insulating member has been provided will be described with reference to FIG. 6. In FIG. 6, reference numeral 601 denotes the metal member; 602, the insulating member; and 603, the photovoltaic device.

The metal member 601 necessarily has a fold at an edge of the photovoltaic device 603, and how it has the fold may greatly affect the service life of the metal member 601. How it has the fold greatly depends on the material, thickness and hardness of the metal member 601, the material, thickness and hardness of the insulating member 602 and to what extent burrs are present at the edge of the photovoltaic device 603. In all of these parameters, it can be expressed by flexure R.

More specifically, the insulating member 602 and the metal member 601 are folded simultaneously at a 90° angle along the edge of the photovoltaic device 603. Here, the flexure R formed in the metal member 601 can be measured with an R (radius) gauge. In the case where the insulating member 602 is formed on the side of the photovoltaic device 603, only the metal member 601 may be folded at a 90° angle, and its flexure R may be measured.

The greater the value of flexure R is, the more it indicates that almost no fold is formed. The smaller it is, the more it indicates that the service life against repeated flexure is short. Accordingly, the greater it is, the more advantageously it acts on the service life or flexing resistance. Especially when it is set to be 0.5 mm or more, a service durability high enough for the metal member to endure over the lifetime of photovoltaic devices can be provided.

Covering Material 105

The covering material 105 according to the present invention is grouped roughly into three kinds, a topside covering material, a filler and a backside covering material.

Topside Covering Material

The topside covering it is required to have light-transmission properties and weatherability and resistance to contamination. In an instance where glass is used as a material therefor, there is a problem that faulty packing may occur unless the filler is thick. In such an instance, there may also be a problem that it not only has a large weight but also tends to break because of an external impact. Accordingly, a weatherable transparent film may preferably be used in the topside covering material. Thus, the packing can be improved, and the covering material can be made lightweight and impact resistant. Moreover, the film surface may be embossed so as to produce an additional effect that the sunlight reflected on the surface is not dazzling. As materials for the covering film, films of fluorine resins such as polyethylene-tetrafluoroethylene (ETFE), polytrifluoroethylene and polyvinyl fluoride may be used, but not limited thereto. Its surface may be subjected to surface treatment such as corona discharging on the side to which the filler is to be bonded, in order for the filler to be bonded with ease.

Filler

The filler is required to have properties including weatherability, thermoplasticity, thermal adhesion and light-transmission properties. As materials therefor, transparent resins such as EVA (ethylene-vinyl acetate copolymer), butyral resins, silicone resins, epoxy resins and fluorinated polyimide resins may be used, but not limited thereto. A cross-linking agent may also be added to the filler so as to be cross-linked. In order to restrain photodeterioration, it is preferable for the filler to be incorporated with an ultraviolet ray absorber. In order to improve crack resistance, the filler may also be incorporated with inorganic matter such as glass fiber.

Backside Covering Material

The backside covering material is used in order to cover the backside of the photovoltaic device module to keep electrical insulation between the photovoltaic device module and the outside. It may preferably be made of a material that can ensure sufficient electrical insulation, yet has an excellent long-term durability, that can withstand impact, scratching, thermal expansion and heat shrinkage, and that exhibits flexibility. Plastic films of nylon, polyethylene terephthalate (PET) and so forth may be used.

The electrical insulation can be maintained only by the filler. However, the filler tends to have an uneven thickness. Hence, at the part having a small thickness or the part having pinholes, there is a possibility of causing a short-circuit between the photovoltaic device and the outside. The backside covering material is used to prevent it.

A metal sheet may also be used as the backside covering material. As materials therefor, stainless steel sheets, coated steel sheets and galvanized steel sheets may be used, but not limited to these. In this instance, it is difficult to maintain electrical insulation between the photovoltaic device module and the outside, and hence an insulating film is provided between the photovoltaic device and the metal sheet. As the insulating film used here, plastic films of nylon, polyethylene terephthalate (PET) and so forth may be used.

Figure 7A:
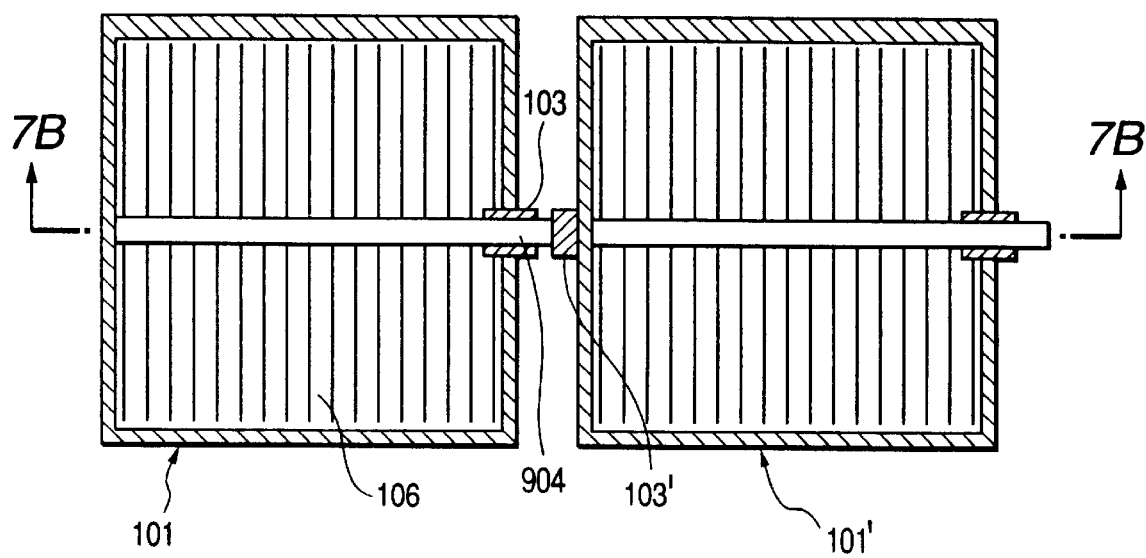
Figure 7B:
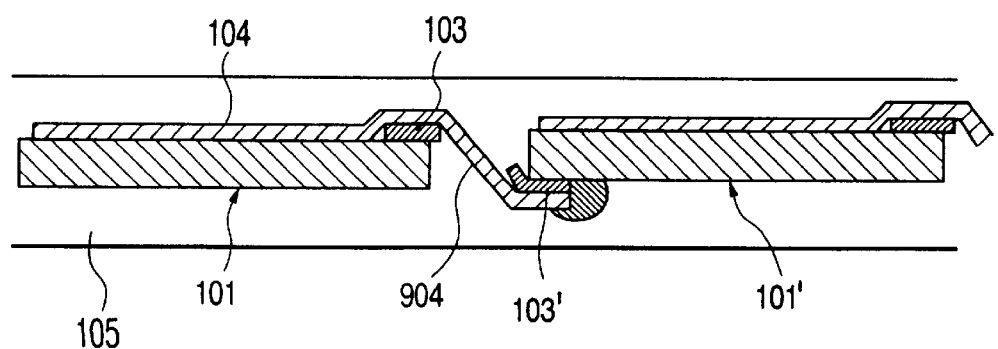

FIGS. 7A and 7B illustrate a preferred example of the photovoltaic device module of the present invention. FIG. 7A is a diagrammatic plan view, and FIG. 7B a cross-sectional view along the line 7B—7B in FIG. 7A. In FIGS. 7A and 7B, reference numerals 101 and 101' each denote a photovoltaic device; 103 and 103', each an insulating member; 104, a bus bar (a metal member); 105, a covering material; 106, a collector electrode. The two photovoltaic devices 101 and 101' are connected through the metal member 104. The insulating members 103 and 103' are so provided that edge portions of the photovoltaic devices do not come into contact with the bus bar (metal member) 104. The present embodiment is the same as the example shown in FIGS. 5A and 5B, except that the photovoltaic devices 101 and 101' are connected through the bus bar 104. In the present embodiment, the bus bar 104 may be called the metal member.

In the present invention, there are no particular limitations on the photovoltaic device itself. An example thereof will be described below.

Photovoltaic Device 101

The photovoltaic device in the present invention may be used in single-crystal, polycrystalline or amorphous silicon solar cells and may be used in solar cells making use of semiconductors other than silicon and in Schottky junction type solar cells.

An amorphous silicon solar cell and a crystal silicon solar cell will be described below specifically.

Amorphous Silicon Solar Cell

Figure 8:
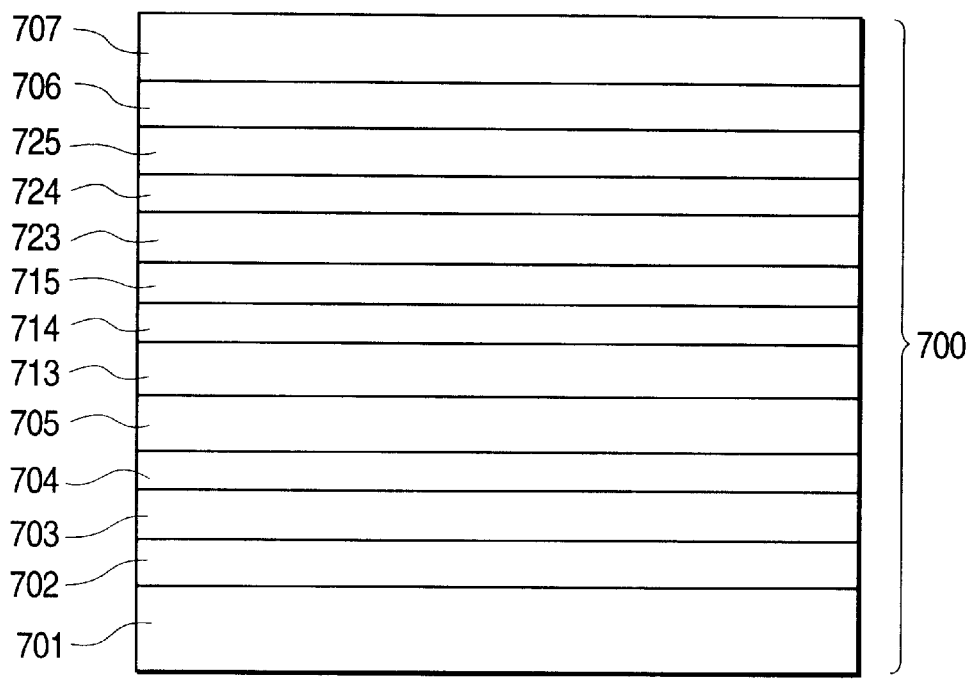
FIG. 8 is a schematic cross-sectional view for illustrating an example of the constitution of an amorphous type photovoltaic device.

FIG. 8 is a diagrammatic cross-sectional view of the amorphous silicon solar cell on which the light is incident on the side opposite to the substrate. In FIG. 8, reference numeral 701 denotes a substrate; 702, a lower electrode;

703, 713 and 723, n-type semiconductor layers; 704, 714 and 724, i-type semiconductor layers; 705, 715 and 725, p-type semiconductor layers; 706, an upper electrode; and 707, a collector electrode.

Substrate

The substrate 701 is a member that mechanically supports the semiconductor layers in the case of a solar cell comprising a thin film such as amorphous silicon film and is also used as an electrode. Accordingly, the substrate 701 is required to have a thermal resistance high enough to withstand the temperature of heat applied when semiconductor layers are formed, but may be either conductive or electrically insulating.

Conductive materials they may include, e.g., metals such as Fe, Ni, Cr, Al, Mo, Au, Nb, Ta, V, Ti, Pt and Pb or alloys of any of these, thin sheets of, e.g., brass or stainless steel, composites thereof, carbon sheets, and galvanized steel sheets. Electrically insulating materials, may include films or sheets of heat-resistant synthetic resins such as polyester, polyethylene, polycarbonate, cellulose acetate, polypropylene, polyvinyl chloride, polyvinylidene chloride, polystyrene, polyamide, polyimide and epoxy, composites of any of these with glass fiber, carbon fiber, boron fiber, metal fiber or the like, and thin sheets of any of these metals or resin sheets whose surfaces have been subjected to surface coating by sputtering, vapor deposition or plating to form thereon metal thin films of different materials and/or insulating thin films of $SiO_2$, $Si_3N_4$, $Al_2O_3$ or AlN, and also glass and ceramics.

Lower Electrode

The lower electrode 702 is one electrode through which the electric power generated in the semiconductor layers is withdrawn, and is required to serve as an ohmic contact with respect to the semiconductor layers.

Materials therefor may include single metals, alloys and transparent conductive oxides (TCO), as exemplified by Al, Ag, Pt, Au, Ni, Ti, Mo, Fe, V, Cr, Cu, stainless steel, brass, nichrome, $SnO_2$, $In_2O_3$, ZnO and ITO.

The lower electrode 702 may preferably have a flat surface, but may be texture-treated on its surface when irregular reflection of light is desired. In the case where the substrate 701 is conductive, it is not especially necessary to provide the lower electrode 702.

The lower electrode may be produced by, e.g., using a process such as plating, vapor deposition or sputtering.

Semiconductor Layers

As the amorphous silicon semiconductor layers, not only a triple construction having the p-i-n structure as shown in FIGS. 7A and 7B, but also a double construction formed by superposing p-i-n structures or p-n structures or a single structure may preferably be used. Semiconductor materials constituting especially the i-layers 704, 714 and 724 may include what is called Group IV and Group IV alloy type amorphous semiconductors such as a Si, a-SiGe and a-SiC.

The amorphous silicon semiconductor layers may be formed by a known process such as vapor deposition, sputtering, high-frequency plasma CVD (chemical vapor deposition), microwave plasma CVD, ECR (electron cyclotron resonance) process, thermal CVD, or LPCVD (low-pressure CVD), any of which may be used as desired. As a film-forming apparatus, a batch type apparatus or a continuous film-forming apparatus may be used as desired.

Upper Electrode

The upper electrode 706 is an electrode through which the electrical energy generated in the semiconductor layers is withdrawn and makes a pair with the lower electrode 702. The upper electrode 706 is necessary when semiconductors having a high sheet resistance as in amorphous silicon are used and is not especially necessary in crystal type solar cells because of their low sheet resistance. Since the upper electrode 706 is located on the light-incident side, it must be transparent and is also called a transparent electrode in some cases.

The upper electrode 706 may preferably have a light transmittance of 85% or more so that the light from the sun or white fluorescent lamps can be absorbed in the semiconductor layers with good efficiency. With regard to electrical properties, it may also preferably have a sheet resistivity of 100 ohms per square so that the electric currents generated by light can flow in the lateral direction with respect to the semiconductor layers. Materials having such properties may include, e.g., metal oxides such as $SnO_2$, $In_2O_3$, ZnO, CdO, $CdSnO_4$, ITO ($In_2O_3+SnO_2$).

Collector Electrode

The collector electrode 707 is commonly formed in a comb, and its preferable width and pitch are determined on the basis of the values of sheet resistivities of the semiconductor layers and upper electrode.

The collector electrode is required to have a low resistivity so as not to form series resistance in the solar cell. It may preferably have a resistivity of from $10^{-2}$ Ω·cm to $10^{-6}$ Ω·cm. Materials suitable for the collector electrode include, e.g., metals such as Ti, Cr, Mo, W, Al, Ag, Ni, Cu, Sn and Pt, or alloys of any of these, and solders. It is common to use metal paste comprising a pasty mixture of metal powder and a high-polymer resin. Examples are by no means limited to these.

Crystal Silicon Solar Cell

Figure 9:
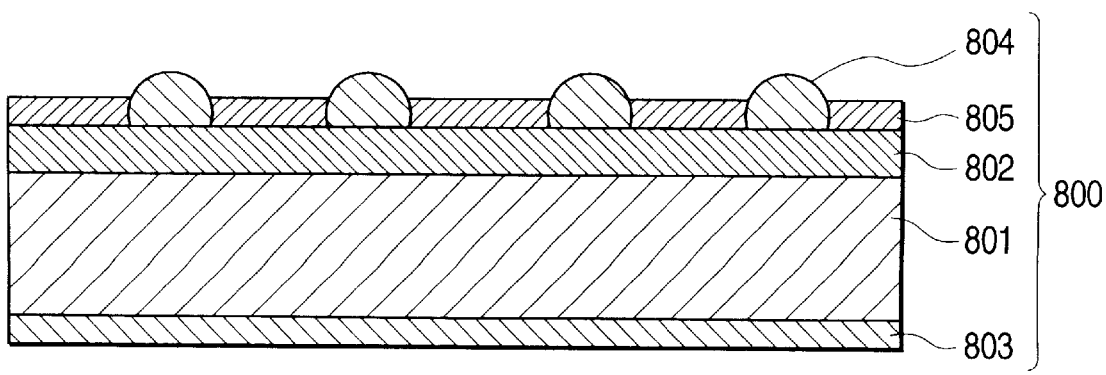
FIG. 9 is a schematic cross-sectional view for illustrating an example of the constitution of a crystal type photovoltaic device.

FIG. 9 is a diagrammatic cross-sectional view of a solar cell of a crystal silicon type such as single-crystal silicon or polycrystalline silicon. In FIG. 9, reference numeral 801 denotes a semiconductor layer comprising a silicon substrate; 802, a semiconductor layer that forms a p-n junction with the semiconductor layer 801; 803, a back electrode; 804, a collector electrode; and 805, an anti-reflection film.

In the case of single-crystal silicon solar cells or polycrystalline silicon solar cells, any supporting substrate is not provided, and single-crystal wafers or polycrystalline wafers serve as substrates. Single-crystal wafers can be obtained by slicing a silicon ingot pulled up by the CZ (Czochralski) method. In the case of polycrystalline wafers, they can be formed by a method in which a silicon ingot obtained by the cast method is sliced or a method in which a sheet-like polycrystal is obtained by the ribbon method.

The p-n junction may be formed by a process such as exemplified gaseous phase diffusion using $POCl_3$, coating diffusion using $TiO_2$, $SiO_2$ or $P_2O_5$, or ion implantation to dope with ions directly; thus, the semiconductor layer 802 is obtained.

The back electrode 803 may be formed by, e.g., forming a metal film by vapor deposition or sputtering or by screen printing of a silver paste.

The anti-reflection film 805 is formed in order to prevent efficiency from decreasing because of the reflection of light on the solar cell surfaces.

Materials usable therefor may include, e.g., $SiO_2$, $Ta_2O_5$ and $Nb_2O_5$.

EXAMPLES

The present invention will be described below in greater detail by giving examples.

Example 1

Figure 10A:
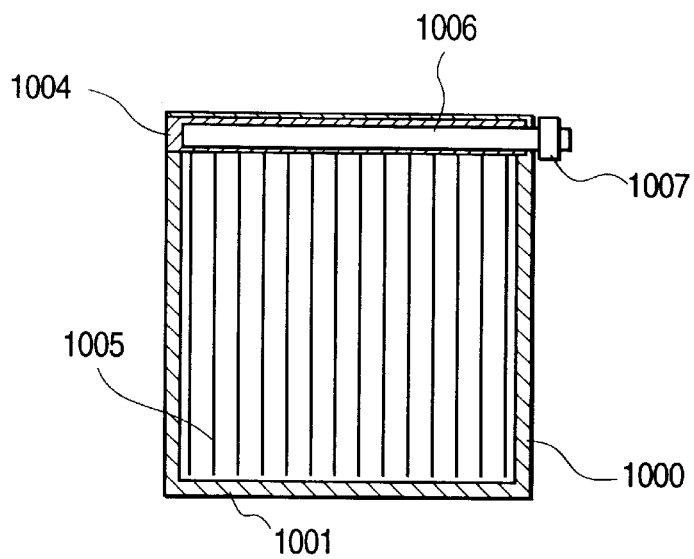
Figure 10B:
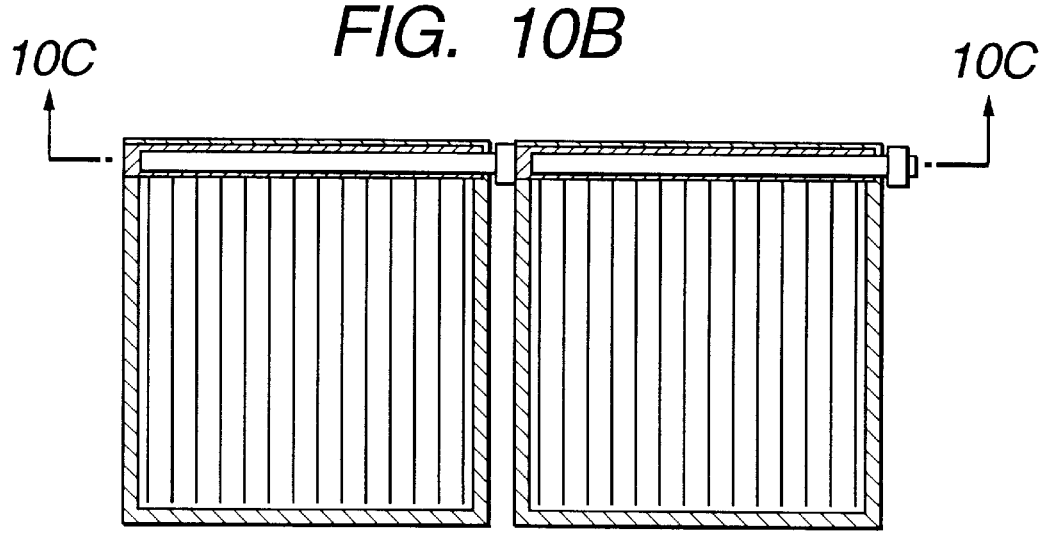
Figure 10C:
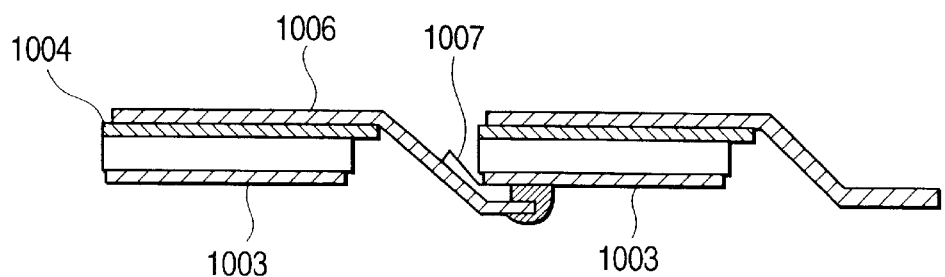

An amorphous silicon solar cell module as shown in FIGS. 10A to 10C was produced. FIG. 10A is a diagrammatic plan view of a photovoltaic device as viewed on the light-receiving side. FIG. 10B is a diagrammatic plan view of a state where photovoltaic devices are connected with each other in series to form a photovoltaic device module, as viewed on the light-receiving side. FIG. 10C is a diagrammatic cross-sectional view along the line 10C—10C in FIG. 10B.

In FIGS. 10A to 10C, reference numeral 1000 denotes a photovoltaic device which comprises a substrate, a lower electrode layer, amorphous silicon having photovoltaic function and an upper electrode layer and which is 300 m×280 mm in size.

The substrate supporting the whole photovoltaic device was a stainless steel sheet 150 μm thick, and the lower electrode layer was formed directly on the substrate by depositing Al and ZnO successively in a thickness of thousands of angstroms each by sputtering.

The amorphous silicon was formed by depositing n-type, i-type, p-type, n-type, i-type, p-type, n-type, i-type and p-type layers in this order from the substrate by plasma CVD. The upper electrode layer was a transparent electrode film, which was formed by vapor-depositing In in an atmosphere of $O_2$ by resistance heating to form an indium oxide thin film of about 700 angstroms thick.

Next, on the photovoltaic device 1000 thus prepared, in order for its effective light-receiving region not to be adversely affected by a short circuit between the substrate and the transparent electrode film which may occur when the photovoltaic device is cut along its outer edges, an etching paste containing $FeCl_3$, $AlCl_3$ or the like was coated on its transparent electrode film by screen printing, followed by heating and then cleaning. Thus, the transparent electrode film of the photovoltaic device was removed partly in lines to form etching lines 1001.

Thereafter, along one side line of edges on the back of the photovoltaic device 1000, a soft copper foil 7.5 mm wide, 285 mm long and 100 μm thick serving as a backside electric power withdrawing member 1003 was connected to the conductive substrate by laser welding.

Thereafter, along one side line of edges of the photovoltaic device 1000 on its light-receiving side opposite to the backside electric power withdrawing member 1003, a polyimide substrate insulating tape was stuck as an insulating member 1004 which was 7.5 mm wide, 280 mm long and 200 μm thick (base material thickness: 100 μm). Here, the insulating member 1004 was stuck in such a way that it protruded a little so that it covered an edge portion along the right side line of the photovoltaic device 1000.

Thereafter, carbon-coated wires comprising copper wire 100 μm in diameter previously coated with carbon paste were formed on the photovoltaic device 1000 and the insulating member 1004 at intervals of 5.6 mm to provide a collector electrode 1005.

On the insulating member 1004, a metal member 1006 was further formed as a bus bar which is an additional collector electrode of the collector electrode 1005. As the metal member 1006, a silver-coated copper foil 5 mm wide, 285 mm long and 100 μm thick was used, which was placed on the insulating member 1004 and thereafter fixed by heating and pressing together with the collector electrode 1005 under conditions of 200° C., 3 kg/cm² and 180 seconds. Here, as shown in FIG. 5A, one side of the metal member 1006 was so made as to extend outward from the photovoltaic device 1000.

Next, a transparent PET tape 7 mm square and 130 μm thick (base material thickness: 100 μm) as an insulating member 1007 was applied onto the metal member 1006 in part at its part protruding from the photovoltaic device 1000.

Photovoltaic devices thus produced were electrically interconnected in series as shown in FIGS. 10B and 10C.

As shown in these drawings, the metal member 1006 with the insulating member 1007 extending outward from the photovoltaic device 1000 was made to crawl to the backside of the adjacent photovoltaic device 1000 and was connected to the backside electric power withdrawing member 1003 by soldering. Here, it was so connected that the insulating member 1007 came into contact with an edge portion of the adjacent photovoltaic device 1000. Incidentally, in the drawings, an instance of series connection of two devices is shown. In practice, five photovoltaic devices were connected in series to make five-series photovoltaic device module A.

Example 2

An amorphous type solar cell module as shown in FIGS. 11A to 11C was produced. FIG. 11A is a diagrammatic plan view of a photovoltaic device as viewed on the light-receiving side. FIG. 11B is a diagrammatic plan view of a state where photovoltaic devices are connected with each other in series to form a photovoltaic device module, as viewed on the light-receiving side. FIG. 11C is a diagrammatic cross-sectional view along the line 11C—11C in FIG. 11B.

Example 2 is the same as Example 1 except that as an insulating member 1107, a black PET tape was stuck to a metal member 1106 on its whole surface.

As the insulating member 1107, a black PET tape available from Toyo Ink Mfg. Co., Ltd., 7.5 mm wide and 130 μm thick (base material thickness: 100 μm) was used, and was stuck to the entire metal member 1106 except for the part to be soldered for series connection in a later step; thus, a photovoltaic device 1100 was completed.

Thereafter, in the same manner as in Example 1, this photovoltaic device was so connected that the insulating member 1107 came into contact with an edge portion of the adjacent photovoltaic device to make five-series photovoltaic device module B.

In the photovoltaic device module B, the part of the metal member 1106 and insulating member 1104 was shielded completely with the black insulating member 1107, and hence the visual appearance was improved as compared to photovoltaic device module A.

Example 3

An amorphous type solar cell module as shown in FIGS. 12A to 12C was produced. FIG. 12A is a diagrammatic plan view of a photovoltaic device as viewed on the light-receiving side. FIG. 12B is a diagrammatic plan view of a state where photovoltaic devices are connected with each other in series to form a photovoltaic device module, as viewed on the light-receiving side. FIG. 12C is a diagrammatic cross-sectional view along the line 12C—12C in FIG. 12B.

Example 3 is the same as Example 1 except that silicone resin was applied as an insulating member 1207 by dotting in a thickness of 200 μm. That is, an insulating member 1204 was so provided as to protrude a little from the right side portion.

As the insulating member 1207, SE9186L, available from Toray Dow Corning Inc., was used and was so applied by dotting as to cover a metal member 1206 completely in width at its part on the metal member 1206, which was then left for 3 days at room temperature. Thus, a photovoltaic device 1200 was completed.

Thereafter, in the same manner as in Example 1, this photovoltaic device was so connected that the insulating member 1207 came into contact with an edge portion of the adjacent photovoltaic device to make five-series photovoltaic device module C.

Example 4

Figure 13A:
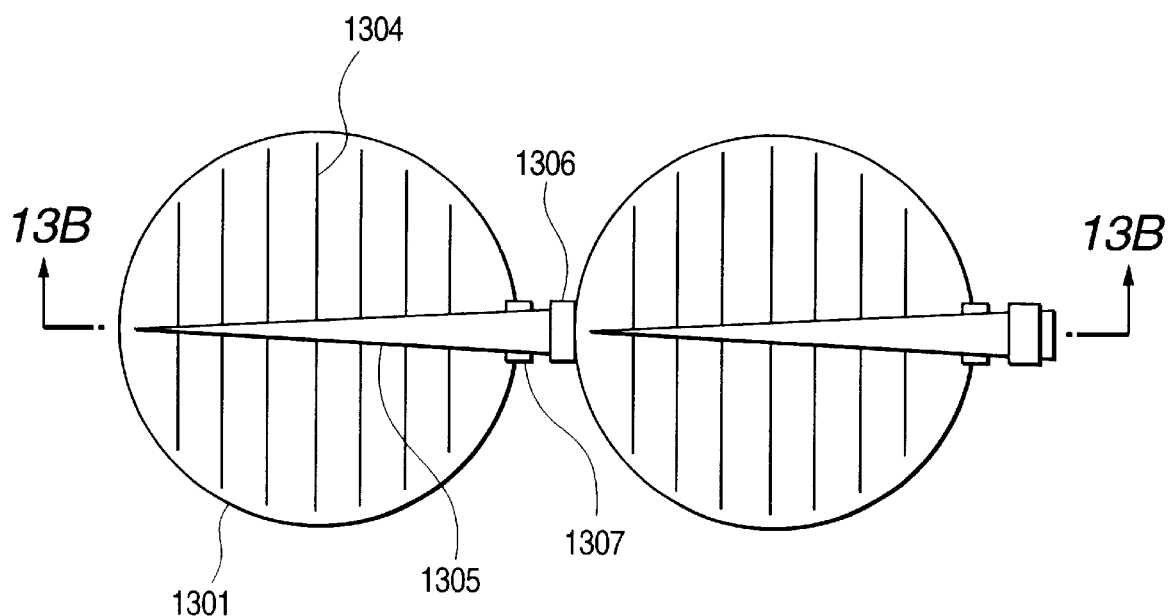
Figure 13B:
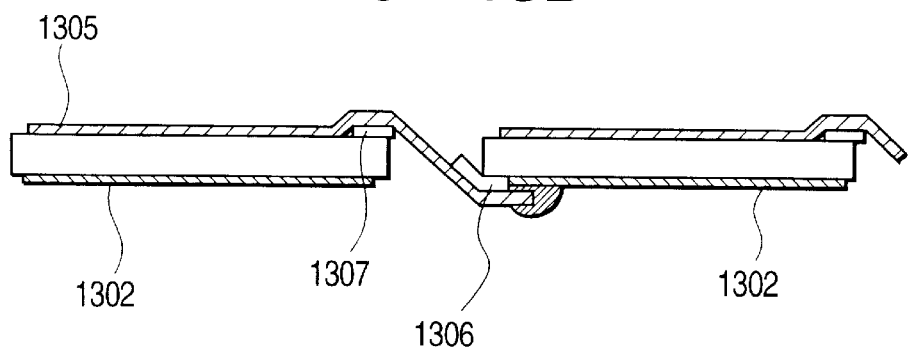

A crystal type solar cell module as shown in FIGS. 13A and 13B was produced. FIG. 13A is a diagrammatic plan view of a state where photovoltaic devices are connected with each other in series to form a photovoltaic device module, as viewed on the light-receiving side. FIG. 13B is a diagrammatic cross-sectional view along the line 13B—13B in FIG. 13A.

In FIGS. 13A and 13B, reference numeral 1301 denotes a photovoltaic device, which is a single-crystal semiconductor layer doped with boron ions on its bottom side and phosphorus ions on the topside. On the lower part of the semiconductor layer, an aluminum paste is coated as a back reflection layer and, on the further lower part of the aluminum paste, a silver paste is coated as a back electrode. As the aluminum paste and the silver paste, what is called sintered pastes were used, which were prepared using as conductive powders aluminum powder and silver powder, respectively, having a particle diameter of from 1 to 3 $\mu$m, and using glass frit as a binder. On the still further lower part of the silver paste, a solder layer 1302 is superposed in order to improve conductivity and facilitate connection.

Meanwhile, on the top of the semiconductor layer, a transparent electrode layer is formed for the purposes of preventing reflection and collecting electricity and, on the further upper part thereof, a collector electrode 1304 was superposed, comprising a silver paste and a solder layer.

In the direction vertical to the collector electrode 1304, for the purpose of further collection of electricity, a metal member 1305 was further formed as a bus bar electrode comprising solder-coated copper.

Next, as an insulating member 1306, a polyimide tape 70 $\mu$m thick (base material thickness: 50 $\mu$m) was stuck onto the metal member 1305 at its part protruding from the photovoltaic device 1301. Also, as an insulating member 1307, a polyimide-like tape was so stuck that an edge portion of the photovoltaic device 1301 did not come into contact with the metal member 1305.

Photovoltaic devices produced in this way were connected electrically in series as shown in FIGS. 13A and 13B.

As shown in these drawings, the metal member 1305 with the insulating member 1306 extending outward from the photovoltaic device 1301 was made to crawl to the backside of the adjacent photovoltaic device, and was connected to the backside solder layer 1302 by soldering. Here, it was so connected that the insulating member 1306 came into contact with an edge portion of the adjacent photovoltaic device. Incidentally, in the drawings, an instance of series connection of two devices is shown. In practice, five photovoltaic devices were connected in series to make five-series photovoltaic device module D.

Example 5

Figure 14A:
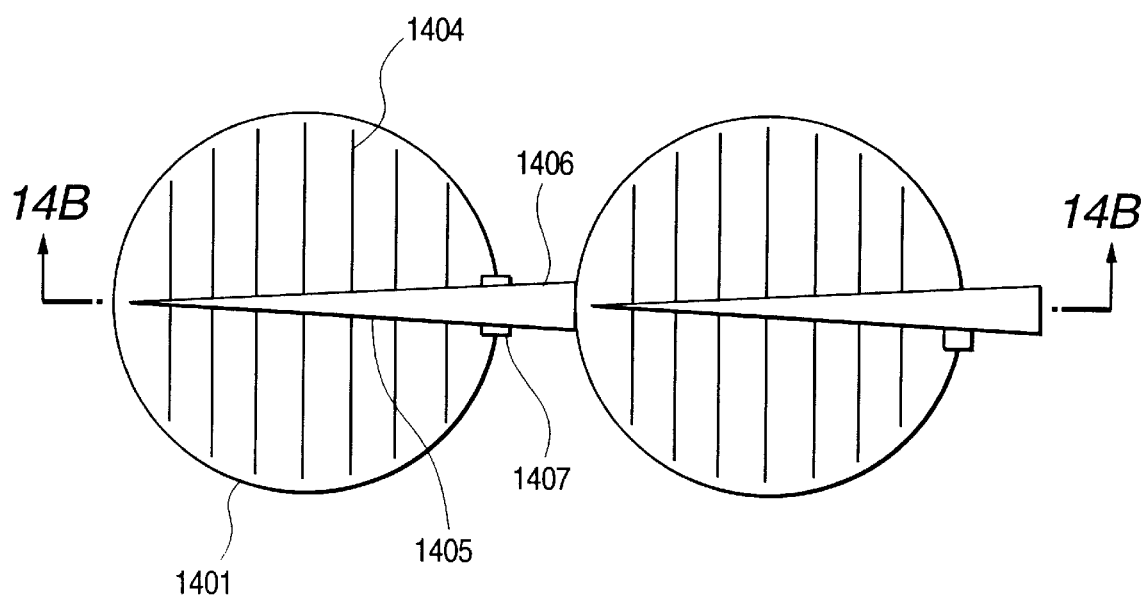
Figure 14B:
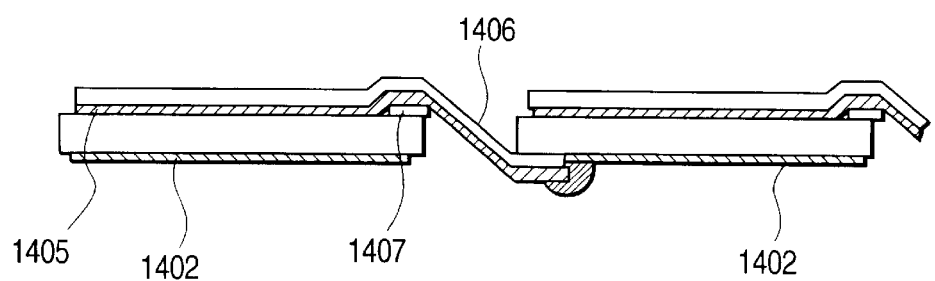

A crystal type solar cell module as shown in FIGS. 14A and 14B was produced. FIG. 14A is a diagrammatic plan view of a state where photovoltaic devices are connected with each other in series to form a photovoltaic device module, as viewed on the light-receiving side. FIG. 14B is a diagrammatic cross-sectional view along the line 14B—14B in FIG. 14A.

Example 5 is the same as Example 4 except that as an insulating member 1406, a black PET tape was stuck to a metal member 1405 on its whole surface.

As the insulating member 1406, a black PET tape available from Toyo Ink Mfg. Co., Ltd., 50 $\mu$m thick (base material thickness: 25 $\mu$m) was used and was stuck to the entire metal member 1405 except for the part to be soldered for series connection in a later step. Thus, a photovoltaic device 1401 was completed.

Thereafter, in the same manner as in Example 4, this photovoltaic device was so connected that the insulating member 1406 came into contact with an edge portion of the adjacent photovoltaic device to make five-series photovoltaic device module E.

Example 6

Figure 15A:
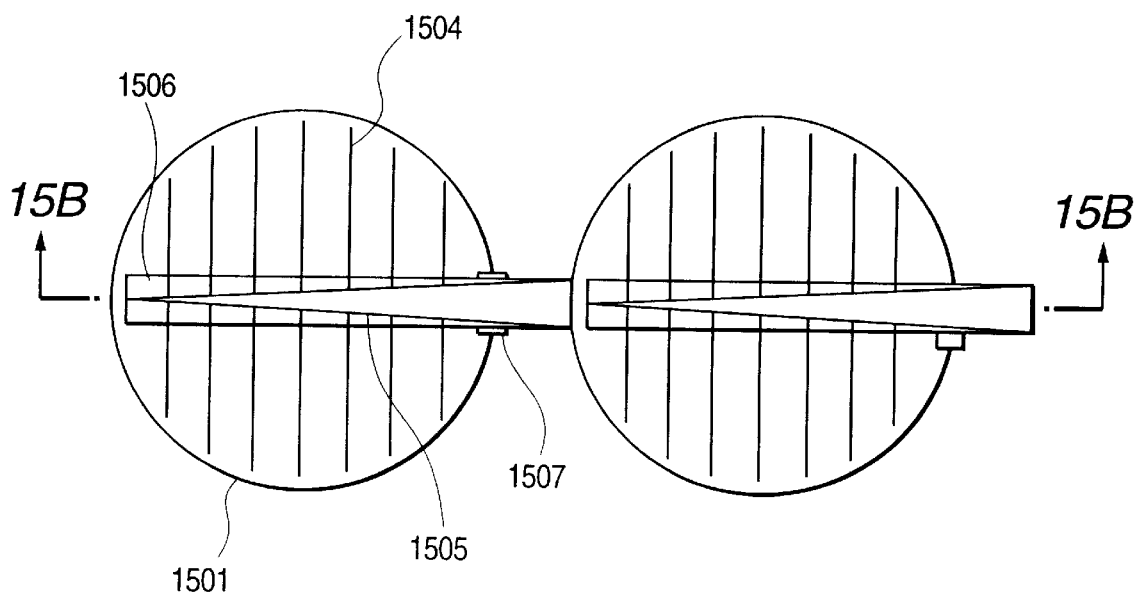
Figure 15B:
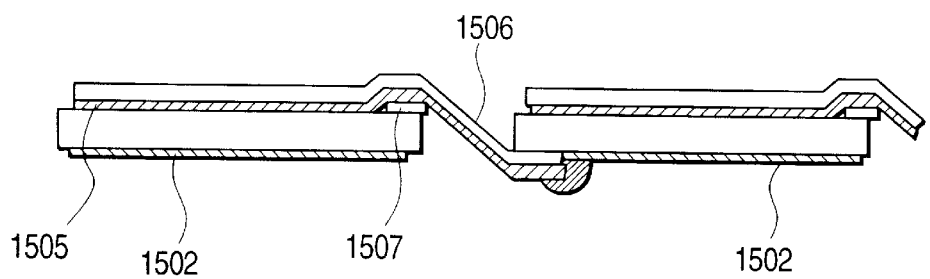

A crystal type solar cell module as shown in FIGS. 15A and 15B was produced. FIG. 15A is a diagrammatic plan view of a state where photovoltaic devices are connected with each other in series to form a photovoltaic device module, as viewed on the light-receiving side. FIG. 15B is a diagrammatic cross-sectional view along the line 15B—15B in FIG. 15A.

Example 6 is the same as Example 4 except that an insulating member 1506 was stuck to a metal member 1505 on its whole surface.

As the insulating member 1506, a transparent PET tape available from Nichiban Co., Ltd., 130 $\mu$m thick (base material thickness: 100 $\mu$m) was used, and was stuck to the entire metal member 1505 except for the part to be soldered for series connection in a later step. Thus a photovoltaic device 1501 was completed. As the tape, one having a rectangular shape was stuck because the insulating member was transparent and any efficiency loss due to shadow did not need to be taken into account.

Thereafter, in the same manner as in Example 4, this photovoltaic device was so connected that the insulating member 1506 came into contact with an edge portion of the adjacent photovoltaic device to make five-series photovoltaic device module F.

Example 7

Figure 16A:
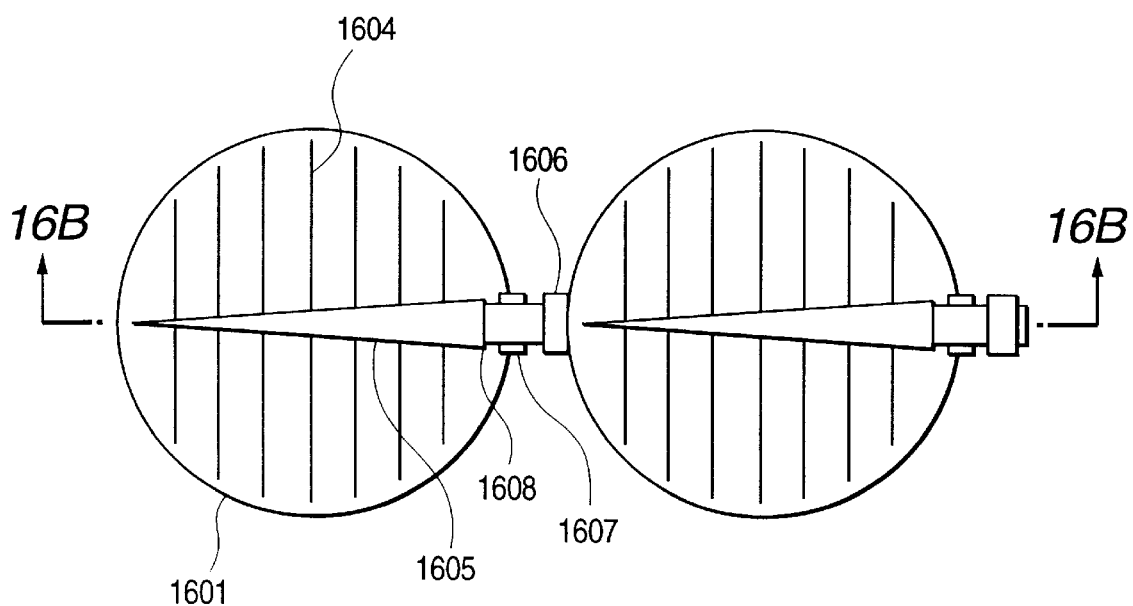
Figure 16B:
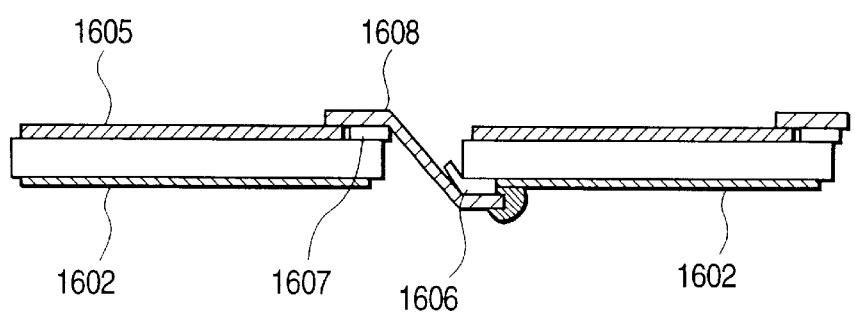

A crystal type solar cell module as shown in FIGS. 16A and 16B was produced. FIG. 16A is a diagrammatic plan view of a state where photovoltaic devices are connected with each other in series to form a photovoltaic device module, as viewed on the light-receiving side. FIG. 16B is a diagrammatic cross-sectional view along the line 16B—16B in FIG. 16A.

Example 7 is the same as Example 4 except that the photovoltaic devices were connected using not a bus bar 1605 but a metal member 1608 as a series connection member.

As the metal member 1608, solder-coated copper 5 mm wide and 100 $\mu$m thick was used, and the metal member 1608 was connected by soldering to the bus bar 1605 of the photovoltaic device and to a solder layer 1602 of the adjoining photovoltaic device.

Thus, five-series photovoltaic device module G was produced.

Comparative Example 1

Figure 17A:
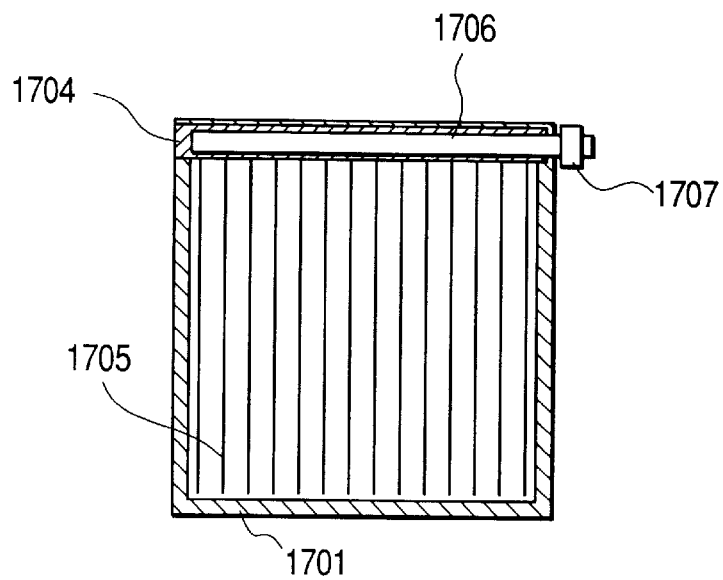
FIG. 17A, FIG. 17B, FIG. 17C, FIG. 18A, FIG. 18B, FIG. 18C, FIG. 19A, FIG. 19B and FIG. 19C illustrate photovoltaic device modules used in the Comparative Examples.
Figure 17B:
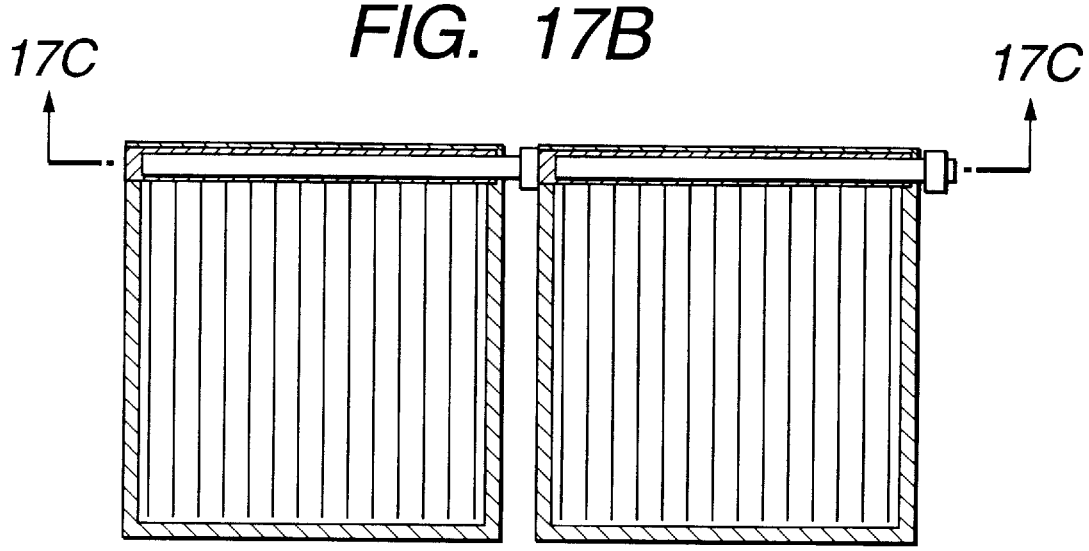
Figure 17C:
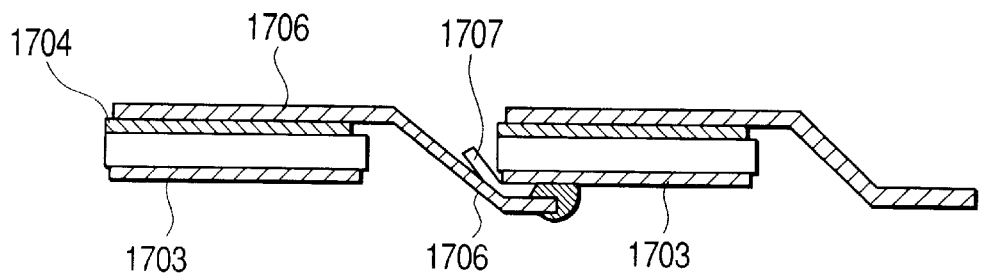

An amorphous type solar cell module as shown in FIGS. 17A to 17C was produced. FIG. 17A is a diagrammatic plan view of a photovoltaic device as viewed on the light-receiving side. FIG. 17B is a diagrammatic plan view of a state where photovoltaic devices are connected with each other in series to form a photovoltaic device module, as viewed on the light-receiving side. FIG. 17C is a diagrammatic cross-sectional view along the line 17C—17C in FIG. 17B.

Comparative Example 1 is the same as Example 1 except that an insulating member 1704 was so provided as not to protrude from the right side portion.

Photovoltaic devices produced were connected in series similarly to make five-series photovoltaic device module A1.

Comparative Example 2

Figure 18A:
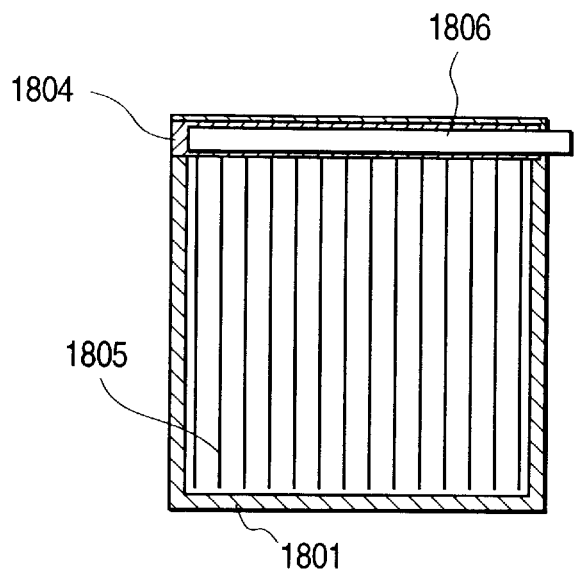
Figure 18B:
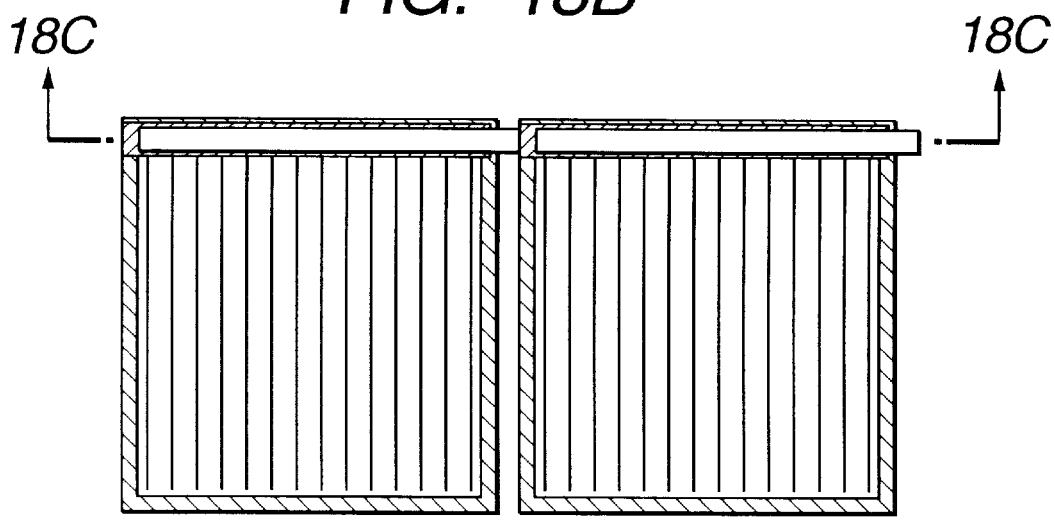
Figure 18C:
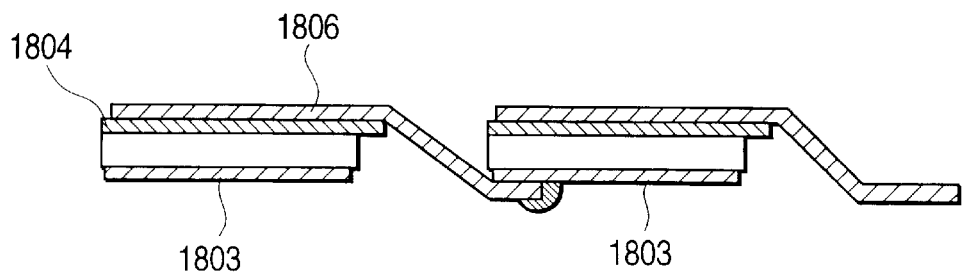

An amorphous type solar cell module as shown in FIGS. 18A to 18C was produced. FIG. 18A is a diagrammatic plan view of a photovoltaic device as viewed on the light-receiving side. FIG. 18B is a diagrammatic plan view of a state where photovoltaic devices are connected with each other in series to form a photovoltaic device module, as viewed on the light-receiving side. FIG. 18C is a diagrammatic cross-sectional view along the line 18C—18C in FIG. 18B.

Comparative Example 2 is the same as Example 1 except that the transparent PET tape (1007 in FIG. 10A or 10C) as an insulating member was not provided.

Photovoltaic devices produced were connected in series similarly to make five-series photovoltaic device module A2.

Comparative Example 3

Figure 19A:
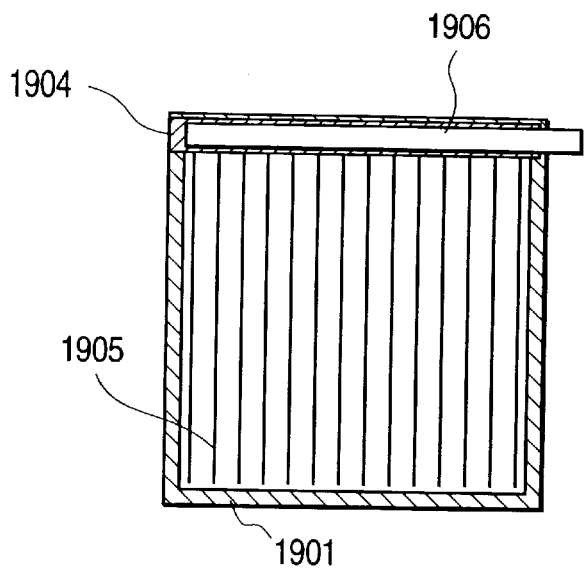
Figure 19B:
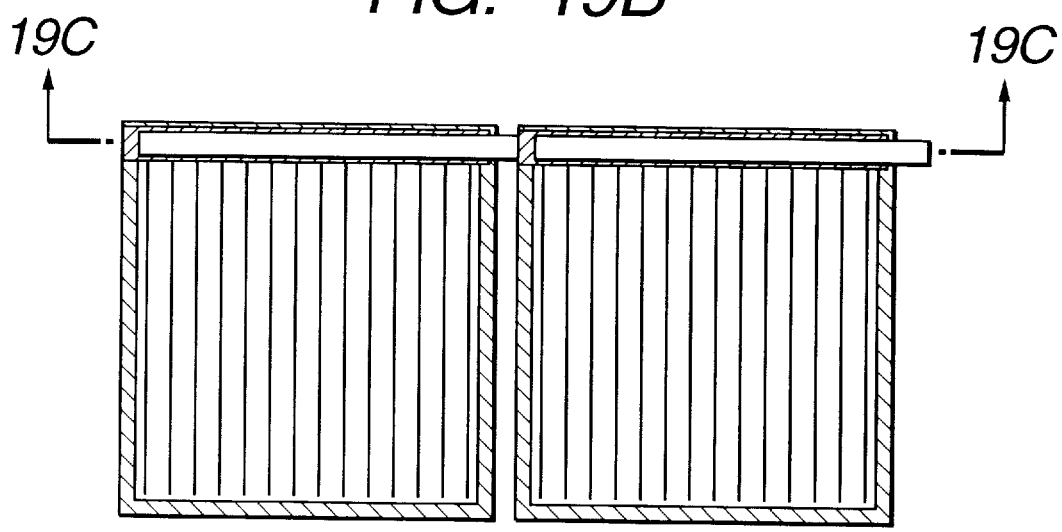
Figure 19C:
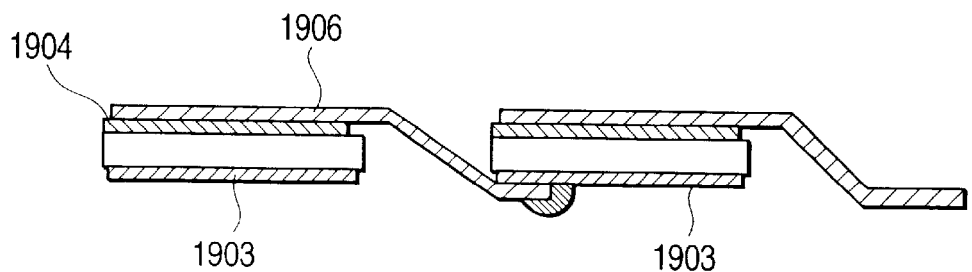

An amorphous type solar cell module as shown in FIGS. 19A to 19C was produced. FIG. 19A is a diagrammatic plan view of a photovoltaic device as viewed on the light-receiving side. FIG. 19B is a diagrammatic plan view of a state where photovoltaic devices are connected with each other in series to form a photovoltaic device module, as viewed on the light-receiving side. FIG. 19C is a diagrammatic cross-sectional view along the line 19C—19C in FIG. 19B.

Comparative Example 3 is the same as Example 1 except that an insulating member 1904 was so provided as not to protrude from the right side portion, and the transparent PET tape (1007 in FIG. 10A or 10C) as an insulating member was not provided.

Photovoltaic devices produced were connected in series similarly to make five-series photovoltaic device module A3.

Comparative Example 4

A solar cell module as shown in FIGS. 13A and 13B was produced in the same manner as in Example 4 except that the insulating members 1306 and 1307 were not provided at all.

Photovoltaic devices produced were connected in series similarly to make five-series photovoltaic device module D1.

Example 8

A solar cell module as shown in FIGS. 10A to 10C was produced in the same manner as in Example 1 except that the insulating members 1004 and 1007 were both provided in a thickness of 40 $\mu$m (base material thickness: 20 $\mu$m).

Photovoltaic devices produced were connected in series similarly to make five-series photovoltaic device module A4.

Example 9

A solar cell module as shown in FIGS. 10A to 10C was produced in the same manner as in Example 1 except that the insulating members 1004 and 1007 were both provided in a thickness of 30 $\mu$m (base material thickness: 10 $\mu$m).

Photovoltaic devices produced were connected in series similarly to make five-series photovoltaic device module A5.

Example 10

A solar cell module as shown in FIGS. 10A to 10C was produced in the same manner as in Example 1 except that the insulating members 1004 and 1007 were both provided in a thickness of 70 $\mu$m (base material thickness: 50 $\mu$m) and the metal member 1006 in a thickness of 35 $\mu$m.

Photovoltaic devices produced were connected in series similarly to make five-series photovoltaic device module A6.

Comparative Tests

Twenty samples were prepared for each of the five-series photovoltaic device modules produced in the Examples and the Comparative Examples. According to an actual procedure, the modules were passed through all the steps in which a load was applied to the devices, e.g., were moved, turned over to lead out terminals, and examined for performance. After they were passed through a series of steps, a visual appearance inspection was made as to whether or not there were modules whose series-connected portions had broken completely or were about to break.

The flexure R was also measured simultaneously on some samples.

Next, one sample with no break at the series-connected portions was picked up from each of the photovoltaic device modules produced and was covered with resin (by lamination). Its procedure is shown below.

The five-series photovoltaic device modules, EVA (ethylene-vinyl acetate copolymer) sheets (available from Spring Born Laboratories Co.; trade name: PHOTOCAP; thickness: 460 $\mu$m), an unstretched ETFE polyethylene tetrafluoroethylene) film (available from Du Pont; trade name: TEFZEL; thickness: 50 $\mu$m) one-side treated by plasma discharge, glass fiber nonwoven fabric (thickness: 200 $\mu$m), a polyethylene terephthalate (PET) film (available from Toray Industries, Inc.; trade name: LUMILAR; thickness: 50 $\mu$m) and a galvanized steel sheet (available from Daido Kohan K. K.; trade name: TYMACOLOR; thickness: 0.4 mm) were superposed in the order of ETFE/glass fiber nonwoven fabric/EVA/nylon/EVA/steel sheet from the top to make up a solar cell module laminate. Next, on the outer side of the ETFE, a stainless steel mesh (40×40 mesh; wire diameter: 0.15 mm) was provided via a release Teflon film (available from Du Pont; trade name: TEFLON PFA FILM; thickness: 50 $\mu$m), and the laminate was heated and press-bonded by means of a vacuum laminator at 150° C. for 30 minutes while deaerating the laminate under pressure. Thus, solar cell modules were obtained.

On the surface of the surface covering material, unevenness of 30 $\mu$m at maximum in undulation difference was formed through the mesh.

An output terminal was beforehand put around to the back of each photovoltaic device module so that the output power can be withdrawn from a terminal lead-out opening made previously in the galvanized steel sheet.

The steel sheet as a reinforcing sheet of this module was further bent at its part extending outside the device by means of a roller former to provide a "roofing material integral type solar cell module" whose reinforcing sheet functioned as a roofing material.

Incidentally, the EVA sheets used here are widely used as sealing materials for solar cells, and are obtained by mixing 1.5 parts by weight of an organic peroxide as a cross-linking agent, 0.3 part by weight of an ultraviolet light absorber, 0.1 part by weight of a photostabilizer, 0.2 part by weight of a thermal oxidation inhibitor and 0.25 part by weight of a silane coupling agent in 100 parts by weight of EVA resin (vinyl acetate content: 33%).

The roofing material integral type solar cell modules thus produced were installed on the same stands as those used in actual roofing, and a repeated flexing test according to IEEE Standard, Draft 9, was made by 30,000 cycles. The repeated flexing test made is a load resistance test having actual roof installation in mind, and conversion efficiency was examined for every 10,000 cycles.

Comparative Test Results and Conclusions

The results of the above comparative test are shown in Table 1 below. With regard to the value of flexure R, it is measured at every edge of the photovoltaic devices produced and shown as a minimum value obtained in the measurement.

TABLE 1

| | Base material thickness of insulating member(s) | Flexure R (mm) | Proportion defective of visual appearance inspection | Test results of repeated flexing |
|---|---|---|---|---|
| Example: | | | | |
| 1 | 100 μm/100 μm | 0.7 | 0/20 samples | AA |
| 2 | 100 μm/100 μm | 0.7 | 0/20 samples | AA |
| 3 | 200 μm/100 μm | 0.9 | 0/20 samples | AA |
| 4 | 50 μm/50 μm | 0.65 | 0/20 samples | AA |
| 5 | 50 μm/25 μm | 0.5 | 0/20 samples | AA |
| 6 | 50 μm/100 μm | 0.75 | 0/20 samples | AA |
| 7 | 50 μm/50 μm | 0.6 | 0/20 samples | AA |
| Comparative Example: | | | | |
| 1 | No member partly | 0.35 | 3/20 samples | B |
| 2 | No member partly | 0.35 | 2/20 samples | B |
| 3 | No member | 0.35 | 2/20 samples | B |
| 4 | No member | 0.2 | 1/20 samples | B |
| Example: | | | | |
| 8 | 20 μm/20 μm | 0.45 | 0/20 samples | A |
| 9 | 15 μm/15 μm | 0.4 | 1/20 samples | A |
| 10 | 50 μm/50 μm | 0.55 | 0/20 samples | AA |

First, with regard to the proportion defective of visual appearance inspection, there was no defective (0) in 20 samples in respect of all the photovoltaic device modules having the insulating member produced in Examples 1 to 7, 8 and 10. On the other hand, a few defective samples occurred in respect of Comparative Examples 1 to 4, not having the insulating members at the contact areas between the metal members and the photovoltaic device edges, and Example 9, having thin insulating members. These defective samples all occurred at contact areas between edges of the photovoltaic devices and metal members. In particular, with regard to Comparative Examples 1 to 3, making use of amorphous silicon, the defective samples occurred at a higher proportion. This was considered ascribable to the burrs present at edges of the amorphous silicon photovoltaic devices, which greatly affected the results. With regard to Example 9, the defective samples were apparently caused by the burrs at edges which broke through the metal members. Also, it was seen from the value of each flexure R that samples having a smaller value showed a higher proportion of defective samples.

From the foregoing results, it is concluded that the load applied to the metal members when handled in a usual manner can be made fairly small by providing insulating members.

Next, with regard to the repeated flexing test, those having no change in performance after 30,000 time flexing are indicated by "AA"; those having a deterioration of conversion efficiency less than 5%, "A"; and those having a deterioration of 5% or more, "B".

As can be seen from these results, the modules produced in Examples 1 to 7 and 10 exhibit no deterioration of conversion efficiency at all, showing good results. The values of flexure R of these are 0.5 mm or more; thus, it is considered that modules that may exhibit no deterioration at all in the repeated flexing test can be provided when the flexure R is set to be 0.5 mm or more. The samples produced in Examples 8 and 9 showed an efficiency deterioration rate of 1.2% and 1.4%, respectively, and there was especially no problem in view of the level of deterioration. By contrast, with regard to the samples of Comparative Examples 1 to 4, not having the insulating members at the contact areas, the efficiency deteriorated by 5% or more. Upon observation made by tearing off the covering materials, the metal members were found to have broken at the edges of the devices.

As can be seen from the above results, the module can be sufficiently durable even in the repeated flexing test when provided with the insulating member in the stated manner, and the performance without deterioration can be achieved, especially when the metal member has a flexure R of 0.5 mm or more when the insulating member is provided.

Not shown in Table 1, the conversion efficiencies of the five-series photovoltaic device modules E and F, produced in Examples 5 and 6, were also measured. As a result, module E showed a conversion efficiency of 15.8%±0.1%, while module F 15.7%±0.1%, showed almost no difference. As can be seen from this fact, the conversion efficiency by no means drops whatever shape the transparent insulating member provided may have.

As described above, according to the present invention, in the photovoltaic device module comprising a plurality of photovoltaic devices connected electrically through a metal member, any break during handling can be prevented and the yield can be improved, when the insulating member is so provided that at least an edge portion of the photovoltaic device does not come into contact with the metal member. Also, the photovoltaic device module can be improved in reliability against repeated flexing when installed as an actual roofing material.

What is claimed is:

1. A photovoltaic module comprising a plurality of photovoltaic devices, adjacent pairs of which are connected electrically through a metal member, wherein an insulating member is so provided as to avoid contact between an edge portion of each of the photovoltaic devices and the metal member and wherein the metal member has a flexure of 0.5 mm or more in a portion thereof which is in contact with the insulating member.

2. The photovoltaic module according to claim 1, wherein the insulating member is provided on the whole upper surface of the metal member.

3. The photovoltaic module according to claim 1, wherein the insulating member has a color of the same color system as the surface color of the photovoltaic devices.

4. The photovoltaic module according to claim 1, wherein the insulating member is transparent.

5. The photovoltaic module according to claim 1, wherein the insulating member comprises an insulating tape having at least a base material and an adhesive, the base material having a thickness of 25 µm or more.

6. The photovoltaic module according to claim 1, wherein the metal member comprises copper coated with a metal selected from the group consisting of silver, solder and nickel.

7. The photovoltaic module according to claim 1, wherein each of the photovoltaic devices has a pair of metal members, one of the pair of metal members being connected to a light-receiving side of the photovoltaic device and the other of the pair of metal members being connected to a non-light-receiving side of the photovoltaic device; and an insulating member is separately disposed (a) between an edge portion of the photovoltaic device and the one of the pair of metal members and (b) between an edge portion of the photovoltaic device and the other of the pair of metal members.

8. The photovoltaic module according to claim 1, wherein each of the photovoltaic devices comprises a supporting member and a semiconductor layer formed on the supporting member.

9. The photovoltaic module according to claim 7, wherein each of the photovoltaic devices comprises a supporting member and a semiconductor layer formed on the supporting member and at least one of the pair of metal members is connected to the supporting member and the other one of the pair of metal members is connected to an electrode provided on the semiconductor layer.

10. The photovoltaic module according to claim 8, wherein the semiconductor layer comprises amorphous silicon.

11. The photovoltaic module according to claim 9, wherein the semiconductor layer comprises amorphous silicon.

12. The photovoltaic module according to claim 1, wherein the photovoltaic devices and the metal member are laminated.

13. The photovoltaic module according to claim 1, wherein the insulating member comprises an organic high-polymer resin or glass cloth.

14. The photovoltaic module according to claim 13, wherein the organic high-polymer resin is a resin selected from the group consisting of acrylic, urethane, polyester, polyimide, vinyl chloride, silicone, fluorine, polyethylene and polypropylene resins.

15. The photovoltaic module according to claim 1, wherein the insulating member comprises a tape or a film having a Shore-D hardness of 50 or more.

16. The photovoltaic module according to claim 5, wherein the insulating member has a thickness of 200 µm or less.

17. The photovoltaic module according to claim 1, wherein each of the photovoltaic devices comprises a silicon substrate and a p-n structure formed on the silicon substrate.

18. The photovoltaic module according to claim 7, wherein each of the photovoltaic devices comprises a silicon substrate and a p-n structure formed on the silicon substrate and at least one of the pair of metal members is electrically connected on a back side of the silicon substrate and the other one of the pair of metal members is electrically connected on a surface side of the silicon substrate.

* * * * *

UNITED STATES PATENT AND TRADEMARK OFFICE
CERTIFICATE OF CORRECTION

PATENT NO. : 6,184,457 B1
DATED : February 6, 2001
INVENTOR(S) : Koji Tsuzuki et al.

It is certified that error appears in the above-identified patent and that said Letters Patent is hereby corrected as shown below:

Column 2,
Line 37, "achieve materialize," should read -- achieve, --; and
Line 66, "by using" should read -- using --.

Column 3,
Line 54, "that," should read -- that --;
Line 60, right margin should be closed; and
Line 61, left margin should be closed.

Column 4,
Line 64, "0.5mm" should read -- 0.5 mm --.

Column 6,
Line 48, "ensure" should read -- ensure a --.

Column 9,
Line 5, "104," should read -- 104 --.

Column 10,
Line 15, "an" should be deleted.

Column 11,
Line 14, "they" should be deleted; and
Line 18, "materials," should read -- materials --.

Column 12,
Line 48, "exemplified" should be deleted.

Column 16,
Line 34, "Thus" should read -- Thus, --.

UNITED STATES PATENT AND TRADEMARK OFFICE
CERTIFICATE OF CORRECTION

PATENT NO. : 6,184,457 B1
DATED : February 6, 2001
INVENTOR(S) : Koji Tsuzuki et al.

It is certified that error appears in the above-identified patent and that said Letters Patent is hereby corrected as shown below:

<u>Column 19,</u>
Line 7, "cells," should read -- cells --; and
Line 57, "member" should read -- members --.

Signed and Sealed this

Fifth Day of March, 2002

Attest:

JAMES E. ROGAN
Attesting Officer  Director of the United States Patent and Trademark Office